United States Patent
Seo et al.

(10) Patent No.: US 10,515,678 B2
(45) Date of Patent: Dec. 24, 2019

(54) MAGNETIC MEMORY DEVICES

(71) Applicant: Samsung Electronics Co., Ltd., Suwon-si, Gyeonggi-do (KR)

(72) Inventors: Boyoung Seo, Suwon-si (KR); Seongui Seo, Suwon-si (KR); Gwanhyeob Koh, Seoul (KR); Yongkyu Lee, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/285,295

(22) Filed: Feb. 26, 2019

(65) Prior Publication Data

US 2019/0259437 A1 Aug. 22, 2019

Related U.S. Application Data

(63) Continuation of application No. 15/294,100, filed on Oct. 14, 2016, now Pat. No. 10,269,401.

(30) Foreign Application Priority Data

Oct. 15, 2015 (KR) .......... 10-2015-0144268
Nov. 9, 2015 (KR) .......... 10-2015-0156320

(51) Int. Cl.
*G11C 11/16* (2006.01)
*H01L 27/22* (2006.01)

(52) U.S. Cl.
CPC .......... *G11C 11/165* (2013.01); *G11C 11/161* (2013.01); *G11C 11/1675* (2013.01); *H01L 27/228* (2013.01)

(58) Field of Classification Search
CPC . G11C 11/165; G11C 11/1675; G11C 11/161; H01L 27/228; H01L 27/224; H01L 43/08; H01L 43/12; H01L 43/02; H01L 27/222
See application file for complete search history.

(56) References Cited

U.S. PATENT DOCUMENTS

| | | |
|---|---|---|
| 7,955,872 B2 | 6/2011 | Matsuzaki |
| 8,044,456 B2 | 10/2011 | Nagashima et al. |
| 8,455,267 B2 | 6/2013 | Li et al. |

(Continued)

FOREIGN PATENT DOCUMENTS

| | | |
|---|---|---|
| JP | 2005056975 | 3/2005 |
| JP | 2010045205 | 2/2010 |

(Continued)

*Primary Examiner* — Stephen W Smoot
*Assistant Examiner* — Sun Mi Kim King
(74) *Attorney, Agent, or Firm* — Myers Bigel, P.A.

(57) ABSTRACT

A magnetic memory device includes a substrate, a landing pad on the substrate, first and second magnetic tunnel junction patterns disposed on the interlayer insulating layer and spaced apart from the landing pad when viewed from a plan view, and an interconnection structure electrically connecting a top surface of the second magnetic tunnel junction pattern to the landing pad. A distance between the landing pad and the first magnetic tunnel junction pattern is greater than a distance between the first and second magnetic tunnel junction patterns, and a distance between the landing pad and the second magnetic tunnel junction pattern is greater than the distance between the first and second magnetic tunnel junction patterns, when viewed from a plan view.

10 Claims, 14 Drawing Sheets

(56) References Cited

U.S. PATENT DOCUMENTS

| | | |
|---|---|---|
| 8,513,751 B2 | 8/2013 | Asao |
| 8,674,465 B2 | 3/2014 | Li et al. |
| 8,883,520 B2 | 11/2014 | Satoh et al. |
| 2004/0188732 A1 | 9/2004 | Fukuzumi |
| 2010/0302838 A1 | 12/2010 | Wang et al. |
| 2014/0264668 A1 | 9/2014 | Lee et al. |
| 2015/0035097 A1 | 2/2015 | Asao |
| 2015/0357376 A1 | 12/2015 | Seo et al. |
| 2018/0198062 A1 * | 7/2018 | Bak .................. H01L 43/12 |

FOREIGN PATENT DOCUMENTS

| | | |
|---|---|---|
| JP | 2010165980 | 7/2010 |
| KR | 20110002706 | 1/2011 |

\* cited by examiner

MAGNETIC MEMORY DEVICES

CROSS-REFERENCE TO RELATED APPLICATIONS

This U.S. non-provisional patent application is a continuation of and claims priority to U.S. patent application Ser. No. 15/294,100, filed Oct. 14, 2016 in the United States Patent and Trademark Office, which in turn claims priority under 35 U.S.C. § 119 to Korean Patent Application Nos. 10-2015-0144268 and 10-2015-0156320, filed on Oct. 15, 2015 and Nov. 9, 2015, respectively, in the Korean Intellectual Property Office, with the disclosures of all of the aforementioned applications hereby incorporated by reference in their entireties for all purposes.

BACKGROUND

Embodiments of the inventive concepts relate to semiconductor devices and methods of manufacturing the same, more particularly, to magnetic memory devices including magnetic tunnel junction patterns and methods of manufacturing the same.

Fast readable/writable and low-voltage memory devices are needed for high-speed and low-power electronic products. Magnetic memory devices have been developed to satisfy these demands. Magnetic memory devices may fill the need for next-generation memory devices because of their high-operational characteristics and ability to store data in a non-volatile manner.

Magnetic memory device use a magnetic tunnel junction (MTJ) pattern to store information. A magnetic tunnel junction pattern may include two magnetic layers and an insulating layer disposed between the two magnetic layers. The resistance of the magnetic tunnel junction pattern depends on the magnetization directions of the two magnetic layers. For example, when the magnetization directions of the two magnetic layers are anti-parallel to each other, the magnetic tunnel junction pattern may have a relatively great resistance. When the magnetization directions of the two magnetic layers are parallel to each other, the magnetic tunnel junction pattern may have a relatively small resistance. The magnetic memory device may read/write data using a difference between the resistances of the magnetic tunnel junction pattern.

In a spin transfer torque-magnetic random access memory (STT-MRAM) device, the magnitude of write current needed to write data to a magnetic cell may be reduced as the size of the magnetic cell decreases. Thus, it is desirable to reduce the size of a STT-MRAM device.

SUMMARY

Embodiments of the inventive concepts provide magnetic memory devices with improved reliability.

In an aspect, a magnetic memory device may include a substrate, a landing pad on the substrate, first and second magnetic tunnel junction patterns disposed on the interlayer insulating layer and spaced apart from the landing pad when viewed from a plan view, and an interconnection structure electrically connecting a top surface of the second magnetic tunnel junction pattern to the landing pad. The first and second magnetic tunnel junction patterns may be spaced apart from each other by a first distance when viewed from a plan view. A distance between the landing pad and the first magnetic tunnel junction pattern may be greater than the first distance when viewed from a plan view. A distance between the landing pad and the second magnetic tunnel junction pattern may be greater than the first distance when viewed from a plan view.

In some embodiments, the magnetic memory device may further include a first bottom electrode provided in the interlayer insulating layer and electrically connected to a bottom surface of the first magnetic tunnel junction pattern, and a second bottom electrode provided in the interlayer insulating layer and electrically connected to a bottom surface of the second magnetic tunnel junction pattern. A top surface of the landing pad may be disposed at a substantially same level as top surfaces of the first and second bottom electrodes.

In some embodiments, the substrate may include first and second selection elements. The first selection element may be electrically connected to a bottom surface of the first magnetic tunnel junction pattern, and the second selection element may be electrically connected to the top surface of the second magnetic tunnel junction pattern through the landing pad and the interconnection structure.

In some embodiments, the magnetic memory device may further include first and second bit lines. The first bit line may be electrically connected to a top surface of the first magnetic tunnel junction pattern, and the second bit line may be electrically connected to a bottom surface of the second magnetic tunnel junction pattern.

In some embodiments, the first and second magnetic tunnel junction patterns may be disposed at a substantially same level.

In some embodiments, the first magnetic tunnel junction pattern may include a first free pattern, a first pinned pattern, and a first tunnel barrier pattern disposed between the first free pattern and the first pinned pattern. The second magnetic tunnel junction pattern may include a second free pattern, a second pinned pattern, and a second tunnel barrier pattern disposed between the second free pattern and the second pinned pattern. A stacking order of the first free pattern and the first pinned pattern may be the same as a stacking order of the second free pattern and the second pinned pattern.

In an aspect, a magnetic memory device may include at least one memory column including a plurality of unit memory cells arranged in a first direction. Each of the unit memory cells may include a landing pad, a first magnetic tunnel junction pattern spaced apart from the landing pad by a first distance when viewed from a plan view, a second magnetic tunnel junction pattern spaced apart from the landing pad by a second distance and spaced apart from the first magnetic tunnel junction pattern by a third distance when viewed from a plan view, and an interconnection structure electrically connecting the landing pad to a top surface of the second magnetic tunnel junction pattern. The first distance and the second distance may be greater than the third distance.

In some embodiments, the first magnetic tunnel junction patterns included in the memory column may be arranged in the first direction. The first distance and the second distance may be greater than a distance in the first direction between the first magnetic tunnel junction patterns when viewed from a plan view.

In some embodiments, the second magnetic tunnel junction patterns included in the memory column may be arranged in the first direction. The first distance and the second distance may be greater than a distance in the first direction between the second magnetic tunnel junction patterns when viewed from a plan view.

In some embodiments, the first magnetic tunnel junction patterns included in the memory column may be arranged in the first direction, and the second magnetic tunnel junction patterns included in the memory column may be arranged in the first direction. The third distance may be equal to a distance in the first direction between the first magnetic tunnel junction patterns and a distance in the first direction between the second magnetic tunnel junction patterns.

In some embodiments, the first magnetic tunnel junction patterns and the second magnetic tunnel junction patterns may be arranged in a zigzag form along the first direction when viewed from a plan view.

In some embodiments, the first magnetic tunnel junction patterns included in the memory column may be arranged in the first direction to constitute a first sub-column, and the second magnetic tunnel junction patterns included in the memory column may be arranged in the first direction to constitute a second sub-column. The landing pads included in the memory column may be arranged in the first direction to constitute a third sub-column. The first to third sub-columns may be spaced apart from each other in a second direction perpendicular to the first direction. The second sub-column may be disposed between the first sub-column and the third sub-column when viewed from a plan view.

In some embodiments, a distance in the second direction between the second sub-column and the third sub-column may be greater than a distance in the second direction between the first sub-column and the second sub-column.

In some embodiments, the first magnetic tunnel junction patterns included in the first sub-column and the second magnetic tunnel junction patterns included in the second sub-column may be arranged in a zigzag form along the first direction when viewed from a plan view.

In some embodiments, the second magnetic tunnel junction patterns included in the second sub-column and the landing pads included in the third sub-column may be arranged in a zigzag form along the first direction when viewed from a plan view.

In some embodiments, the at least one memory column may include first and second memory columns adjacent to each other in the second direction. The third sub-column of the first memory column may be adjacent to the first sub-column of the second memory column.

In some embodiments, a distance in the second direction between the third sub-column of the first memory column and the first sub-column of the second memory column may be greater than a distance in the second direction between the first and second sub-columns of the first memory column.

In some embodiments, a minimum distance between the landing pad included the third sub-column of the first memory column and the first magnetic tunnel junction pattern included in the first sub-column of the second memory column may be greater than the third distance.

In some embodiments, the at least one memory column may include first and second memory columns adjacent to each other in the second direction. The first sub-column of the first memory column may be adjacent to the first sub-column of the second memory column.

In some embodiments, a distance in the second direction between the first sub-column of the first memory column and the first sub-column of the second memory column may be smaller than a distance in the second direction between the second and third sub-columns of the first memory column.

In some embodiments, the distance in the second direction between the first sub-column of the first memory column and the first sub-column of the second memory column may be equal to a distance in the second direction between the first and second sub-columns of the first memory column.

In some embodiments, a minimum distance between the first magnetic tunnel junction pattern included in the first sub-column of the first memory column and the first magnetic tunnel junction pattern included in the first sub-column of the second memory column may be smaller than the second distance.

In some embodiments, the magnetic memory device may further include a first bit line electrically connected to top surfaces of the first magnetic tunnel junction patterns included in the first sub-column, and a second bit line electrically connected to bottom surfaces of the second magnetic tunnel junction patterns included in the second sub-column.

In another aspect, a magnetic memory device includes a substrate, an interlayer insulation layer on the substrate, and a magnetic memory cell on the substrate. The magnetic memory cell includes a landing pad on the substrate, first and second magnetic tunnel junction patterns in the interlayer insulation layer and spaced apart from the landing pad, a first bit line conductively connected to an upper portion of the first magnetic tunnel junction pattern, a second bit line conductively connected to a lower portion of the first magnetic tunnel junction pattern, and an interconnection on the landing pad, the interconnection structure penetrating the interlayer insulation layer and conductively connecting the landing pad to an upper portion of the second magnetic tunnel junction pattern. The second magnetic tunnel junction pattern is between the first magnetic tunnel junction pattern and the landing pad, and a first separation distance between the second magnetic tunnel junction pattern and the landing pad is greater than a second separation distance between the first magnetic tunnel junction pattern and the second magnetic tunnel junction pattern.

Each of the first and second magnetic tunnel junction patterns may include a pinned pattern, a tunnel barrier pattern, and a free patterned stacked in order on the substrate. The pinned pattern in each of the first and second magnetic tunnel junctions may be between the free pattern and the substrate.

The interconnection may be conductively coupled to the free pattern of the second magnetic tunnel junction, the first bit line may be conductively coupled to the free pattern of the first magnetic tunnel junction, and the second bit line may be conductively coupled to the pinned pattern of the first magnetic tunnel junction.

The first magnetic tunnel junction may be spaced apart from the second magnetic tunnel junction and the landing pad in a first direction, and the second magnetic tunnel junction may be offset from the first magnetic tunnel junction in a second direction that is perpendicular to the first direction.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
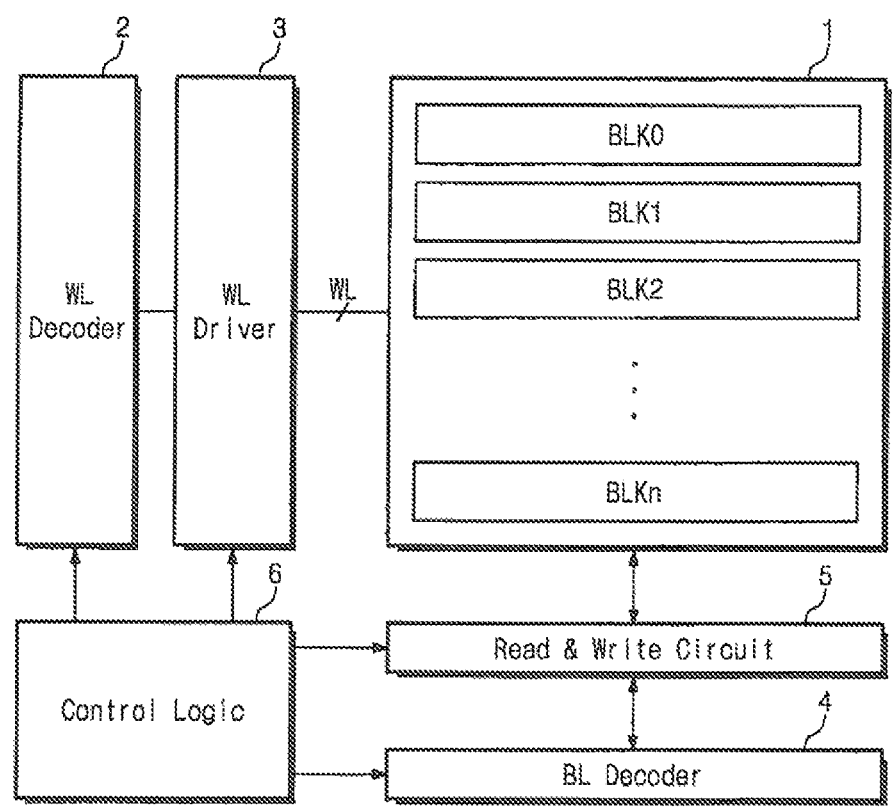
FIG. 1 is a schematic block diagram illustrating a magnetic memory device according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

FIG. 1 is a schematic block diagram illustrating a magnetic memory device according to some embodiments of the inventive concepts.

Referring to FIG. 1, a magnetic memory device includes a memory cell array 1, a word line decoder 2, a word line driver 3, a bit line decoder 4, a read & write circuit 5, and a control logic circuit 6.

The memory cell array 1 may include a plurality of memory blocks BLK0 to BLKn. Each of the memory blocks BLK0 to BLKn may include a plurality of memory cells, a plurality of word lines, a plurality of bit lines, and a plurality of source lines. The word lines, the bit lines, and the source lines may be electrically connected to the memory cells.

The word line decoder 2 may decode an address signal input from an external system to select one of the word lines. The address signal decoded in the word line decoder 2 may be provided to the word line driver 3. The word line driver 3 may provide a selected word line voltage and unselected word line voltages generated from a voltage generation circuit (not shown) to the selected word line and unselected word lines, respectively, in response to a control signal output by the control logic circuit 6. The word line decoder 2 and the word line driver 3 may be connected in common to the plurality of memory blocks BLK0 to BLKn and may provide driving signals to the word lines of one memory block selected by a block selection signal.

The bit line decoder 4 may decode an address signal inputted from the external system to select one of the bit lines. The bit line decoder 4 may be connected in common to the plurality of memory blocks BLK0 to BLKn and may provide data to the bit lines of the memory block selected by the block selection signal.

The read & write circuit 5 may be connected to the memory cell array 1 through the bit lines. The read & write circuit 5 may select one of the bit lines in response to a bit line selection signal received from the bit line decoder 4. The read & write circuit 5 may be configured to exchange data with the external system. The read & write circuit 5 may be operated in response to a control signal output by the control logic circuit 6. The read & write circuit 5 may receive power (e.g., a voltage or current) from the control logic circuit 6 and may provide the power to the selected bit line.

The control logic circuit 6 may control overall operations of the magnetic memory device. The control logic circuit 6 may receive control signals and an external voltage and may be operated in response to the received control signals. The control logic circuit 6 may generate power necessary to perform read/write operations by means of the external voltage. The control logic circuit 6 may control a read operation, a write operation, and/or an erase operation in response to the control signals.

Figure 2:
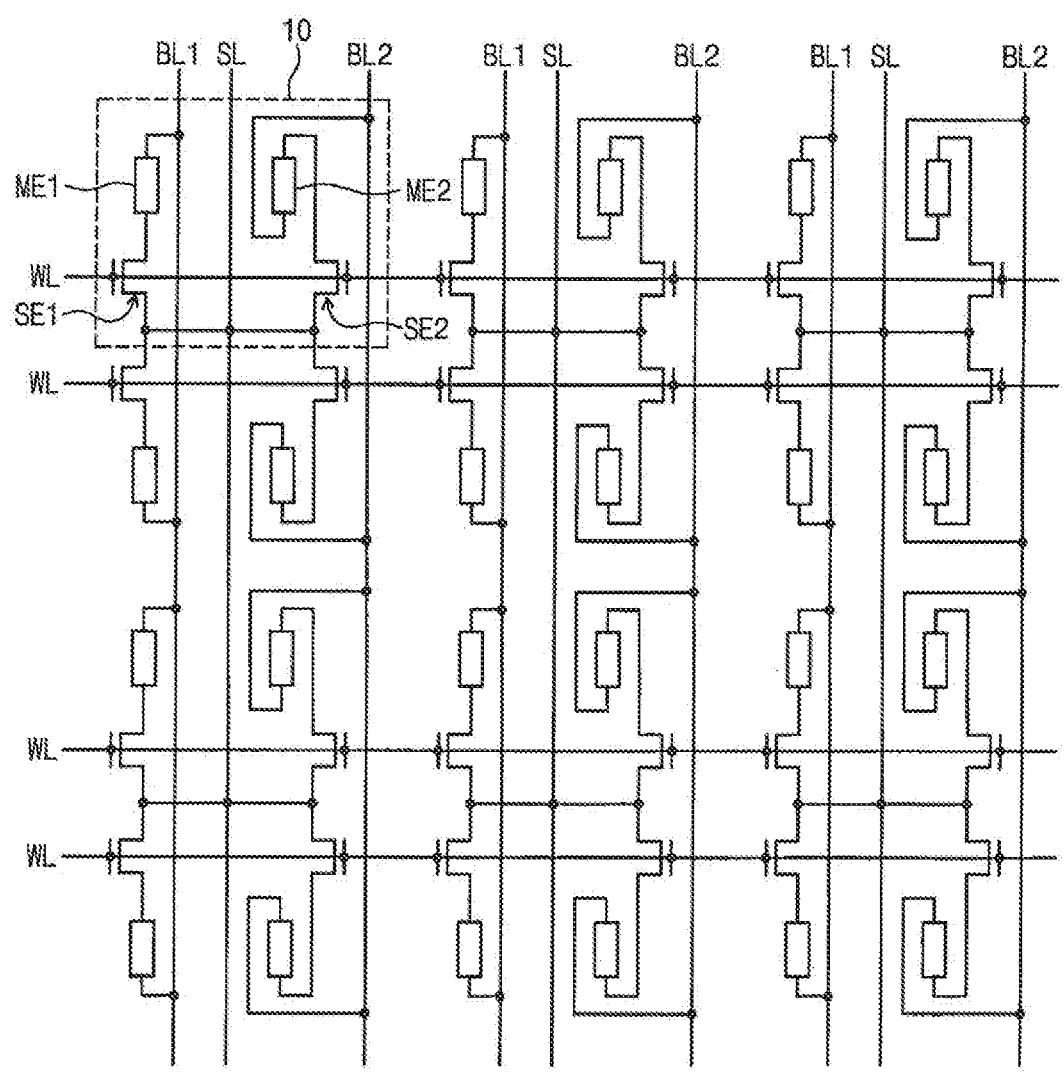
FIG. 2 is a circuit diagram illustrating a cell array of a magnetic memory device according to some embodiments of the inventive concepts.

FIG. 2 is a circuit diagram illustrating a cell array of a magnetic memory device according to some embodiments of the inventive concepts. For example, FIG. 2 is a circuit diagram illustrating an embodiment of the memory cell array described with reference to FIG. 1.

Referring to FIG. 2, the memory cell array 1 may include a plurality of word lines WL, a plurality of bit lines BL1 and BL2, a plurality of source lines SL, and a plurality of unit memory cells 10. The bit lines BL1 and BL2 may intersect the word lines WL. As illustrated in FIG. 2, the source lines SL may be parallel to the bit lines BL1 and BL2. However, embodiments of the inventive concepts are not limited thereto. In certain embodiments, the source lines SL may be parallel to the word lines WL, unlike FIG. 2.

Each of the unit memory cells 10 may be connected between one word line WL and a pair of bit lines BL1 and BL2 intersecting the one word line WL. Each of the unit memory cells 10 may include first and second memory elements ME1 and ME2 and first and second selection elements SE1 and SE2.

The first memory element ME1 may be connected between the first selection element SE1 and a first bit line BL1, and the second memory element ME2 may be connected between the second selection element SE2 and a second bit line BL2. The first selection element SE1 may be connected between the first memory element ME1 and the source line SL, and the second selection element SE2 may be connected between the second memory element ME2 and the source line SL. The first and second selection elements SE1 and SE2 may share one source line SL and may be controlled by the same word line WL. In addition, the unit memory cells 10 arranged in a first direction or a second direction perpendicular to the first direction may be connected in common to the source line SL.

One unit memory cell 10 may be selected by one word line WL and a pair of bit lines BL1 and BL2. In some embodiments, each of the first and second memory elements ME1 and ME2 may be a variable resistance element which is switchable between two resistance states by an electrical pulse applied thereto. The first and second memory elements ME1 and ME2 may be formed of materials that have resistance values that change according to a magnitude and/or a direction of a current or voltage applied thereto, and may have a non-volatile characteristic such that they are capable of retaining a stored resistance value even though the current or voltage to the memory elements is interrupted. In some embodiments, each of the first and second memory elements ME1 and ME2 may have a magnetoresistance property. In some embodiments, each of the first and second memory elements ME1 and ME2 may be a magnetic tunnel junction pattern to be described later with reference to FIGS. 9A and/or 9B. In certain embodiments, each of the first and second memory elements ME1 and ME2 may include a perovskite compound or a transition metal oxide.

Each of the first and second selection elements SE1 and SE2 may be a diode, a PNP bipolar transistor, an NPN bipolar transistor, an NMOS field effect transistor, or a PMOS field effect transistor. In some embodiments, the first and second selection elements SE1 and SE2 may control the supply of currents to the first and second memory elements ME1 and ME2 in response to a voltage on the word lines WL.

Figure 3:
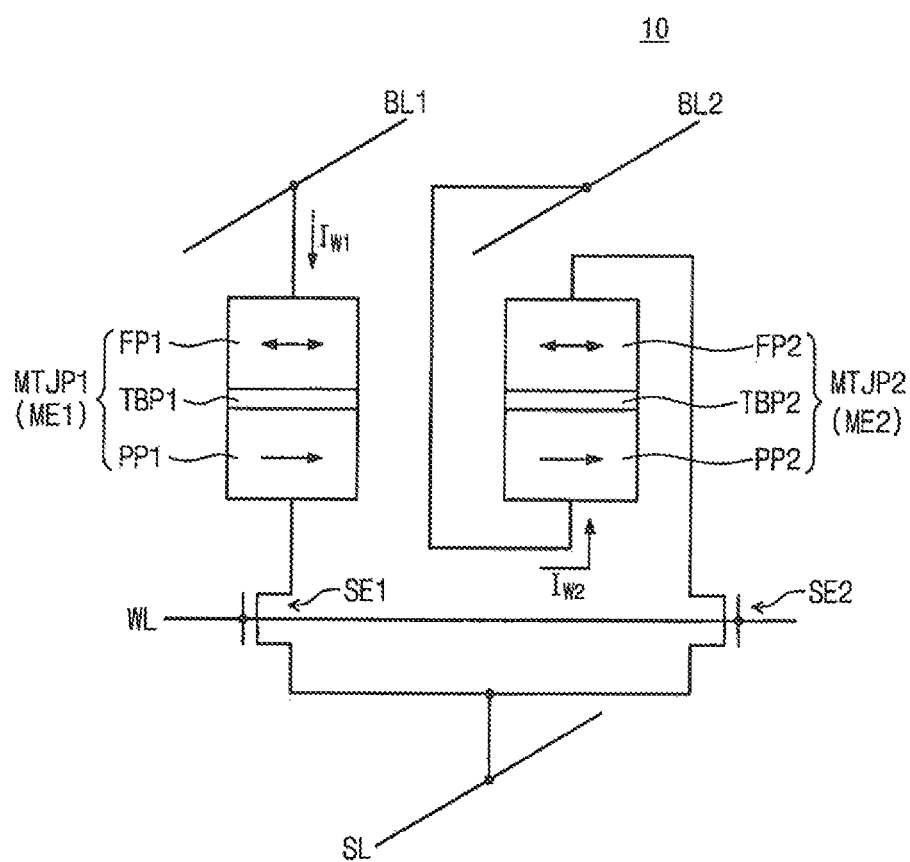
FIG. 3 is a circuit diagram illustrating a unit memory cell of a magnetic memory device according to some embodiments of the inventive concepts.

FIG. 3 is a circuit diagram illustrating a unit memory cell of a magnetic memory device according to some embodiments of the inventive concepts. For example, FIG. 3 is a circuit diagram illustrating an embodiment of the unit memory cell described with reference to FIG. 2.

Referring to FIG. 3, the unit memory cell 10 may include first and second magnetic tunnel junction patterns MTJP1 and MTJP2 used as the memory elements ME1 and ME2, and first and second selection transistors SE1 and SE2 used as the selection elements. The first magnetic tunnel junction pattern MTJP1 may include a first free pattern FP1, a first pinned pattern PP1, and a first tunnel barrier pattern TBP1 disposed between the first free pattern FP1 and the first pinned pattern PP1. Likewise, the second magnetic tunnel junction pattern MTJP2 may include a second free pattern FP2, a second pinned pattern PP2, and a second tunnel barrier pattern TBP2 disposed between the second free pattern FP2 and the second pinned pattern PP2. Each of the first and second pinned patterns PP1 and PP2 may have a magnetization direction fixed in one direction. The first free pattern FP1 may have a magnetization direction that is changeable to be parallel or anti-parallel to the magnetization direction of the first pinned pattern PP1, and the second free pattern FP2 may have a magnetization direction that is changeable to be parallel or anti-parallel to the magnetization direction of the second pinned pattern PP2. According to some embodiments of the inventive concepts, each of the first and second magnetic tunnel junction patterns MTJP1 and MTJP2 may be substantially similar to a magnetic tunnel junction pattern to be described later with reference to FIGS. 9A and/or 9B.

The first and second bit lines BL1 and BL2 may intersect the word line WL, and the source line SL may be connected in common to the first and second selection transistors SE1 and SE2. The first magnetic tunnel junction pattern MTJP1 may be connected between the first bit line BL1 and the first selection transistor SE1, and the first selection transistor SE1 may be connected between the first magnetic tunnel junction pattern MTJP1 and the source line SL. The second magnetic tunnel junction pattern MTJP2 may be connected between the second bit line BL2 and the second selection transistor SE2, and the second selection transistor SE2 may be connected between the second magnetic tunnel junction pattern MTJP2 and the source line SL.

In some embodiments, as illustrated in FIG. 3, the first free pattern FP1 may be connected to the first bit line BL1, and the first pinned pattern PP1 may be connected to the first selection transistor SE1. In these embodiments, the second free pattern FP2 may be connected to the second selection transistor SE2, and the second pinned pattern PP2 may be connected to the second bit line BL2.

In certain embodiments, unlike FIG. 3, the first pinned pattern PP1 may be connected to the first bit line BL1, and the first free pattern FP1 may be connected to the first selection transistor SE1. In these embodiments, the second pinned pattern PP2 may be connected to the second selection transistor SE2, and the second free pattern FP2 may be connected to the second bit line BL2. Hereinafter, the unit memory cell 10 illustrated in FIG. 3 will be described as an example for the purpose of ease and convenience in explanation.

In some embodiments, to write a data value of 1 into a selected unit memory cell 10, a turn-on voltage may be applied to the word line WL connected to the selected unit memory cell 10. A first bit line voltage may be applied to the first and second bit lines BL1 and BL2, and a first source line voltage lower than the first bit line voltage may be applied to the source line SL.

Under these voltage conditions, the first and second selection transistors SE1 and SE2 may be turned-on to electrically connect the first and second magnetic tunnel junction patterns MTJP1 and MTJP2 to the source line SL. A first write current $I_{W1}$ flowing from the first bit line BL1 to the source line SL may be provided to the first magnetic tunnel junction pattern MTJP1, and a second write current $I_{W2}$ flowing from the second bit line BL2 to the source line SL may be provided to the second magnetic tunnel junction pattern MTJP2. Here, the flowing direction of the first write current $I_{W1}$ may be opposite to the flowing direction of the second write current $I_{W2}$ from the viewpoint of the first and second magnetic tunnel junction patterns MTJP1 and MTJP2. In other words, when the same voltage is applied to the first and second bit lines BL1 and BL2, the write currents flowing in directions opposite to each other may be supplied to the first magnetic tunnel junction pattern MTJP1 and the second magnetic tunnel junction pattern MTJP2.

In more detail, the first write current $I_{W1}$ may be provided in a direction from the first free pattern FP1 to the first pinned pattern PP1 of the first magnetic tunnel junction pattern MTJP1, and thus electrons of the first write current $I_{W1}$ may be provided in a direction from the first pinned pattern PP1 to the first free pattern FP1. In this case, electrons having spins in the same direction as the magnetization direction of the first pinned pattern PP1 may pass through the first tunnel barrier pattern TBP1 (e.g., by a tunneling effect) to apply torque to the first free pattern FP1. As a result, the magnetization direction of the first free pattern FP1 may be changed to be parallel to the magnetization direction of the first pinned pattern PP 1. On the contrary, the second write current $I_{W2}$ may be provided in a direction from the second pinned pattern PP2 to the second free pattern FP2 of the second magnetic tunnel junction pattern MTJP2, and thus electrons of the second write current $I_{W2}$ may be provided in a direction from the second free pattern FP2 to the second pinned pattern PP2. In this case, electrons having spins in a direction opposite to the magnetization direction of the second pinned pattern PP2 may not pass through the second tunnel barrier pattern TBP2 (by a tunneling effect) but may be reflected from the second tunnel barrier pattern TBP2 into the second free pattern FP2 to apply torque to the second free pattern FP2. As a result, the magnetization direction of the second free pattern FP2 may be changed to be anti-parallel to the magnetization direction of the second pinned pattern PP2.

As described above, when the data value of 1 is written in the selected unit memory cell 10, the first magnetic tunnel junction pattern MTJP1 may be written such that the magnetization directions of the first free pattern FP1 and the first pinned pattern PP1 are parallel to each other, and the second magnetic tunnel junction pattern MTJP2 may be written such that the magnetization directions of the second free pattern FP2 and the second pinned pattern PP2 are anti-parallel to each other. In other words, the first magnetic tunnel junction pattern MTJP1 may have a low resistance state, and the second magnetic tunnel junction pattern MTJP2 may have a high resistance state.

In some embodiments, to write a data value of 0 into the selected unit memory cell 10, the turn-on voltage may be applied to the word line WL connected to the selected unit memory cell 10. In addition, a second bit line voltage may be applied to the first and second bit lines BL1 and BL2, and a second source line voltage higher than the second bit line voltage may be applied to the source line SL.

Under these voltage conditions, currents in directions opposite to the first and second write currents $I_{W1}$ and $I_{W2}$ described above may be provided to the first and second magnetic tunnel junction patterns MTJP1 and MTJP2, respectively. Thus, on the contrary to when the data value of 1 is written, the first magnetic tunnel junction pattern MTJP1 may be written such that the magnetization directions of the first free and pinned patterns FP1 and PP1 are anti-parallel to each other, and the second magnetic tunnel junction pattern MTJP2 may be written such that the magnetization directions of the second free and pinned patterns FP2 and PP2 are parallel to each other. In other words, the first magnetic tunnel junction pattern MTJP1 may have a high resistance state, and the second magnetic tunnel junction pattern MTJP2 may have a low resistance state.

Since the first and second magnetic tunnel junction patterns MTJP1 and MTJP2 have the resistance states different from each other as described above, the resistance value of one of the first and second magnetic tunnel junction patterns MTJP1 and MTJP2 may be used as a reference resistance value when data is read out from the selected unit memory cell 10. Accordingly, the unit memory cell 10 may have a sensing margin corresponding to a difference between the resistance values of the first magnetic tunnel junction pattern MTJP1 and the second magnetic tunnel junction pattern MTJP2. As a result, reliability of the unit memory cell 10 may be improved.

Figure 4:
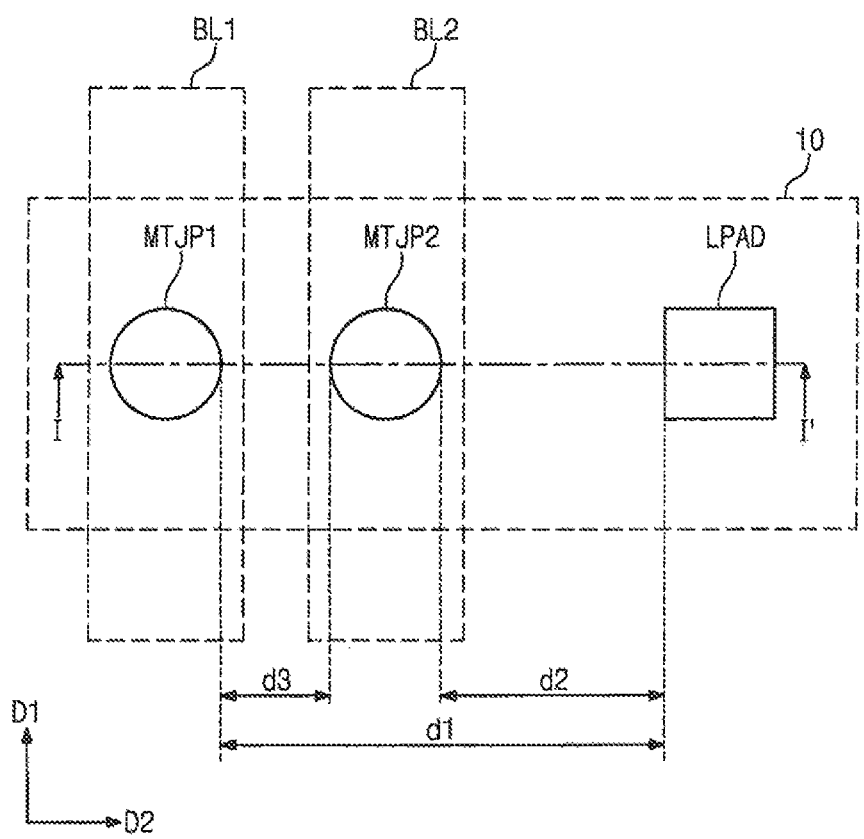
FIG. 4 is a plan view illustrating a unit memory cell of a magnetic memory device according to some embodiments of the inventive concepts.
Figure 5:
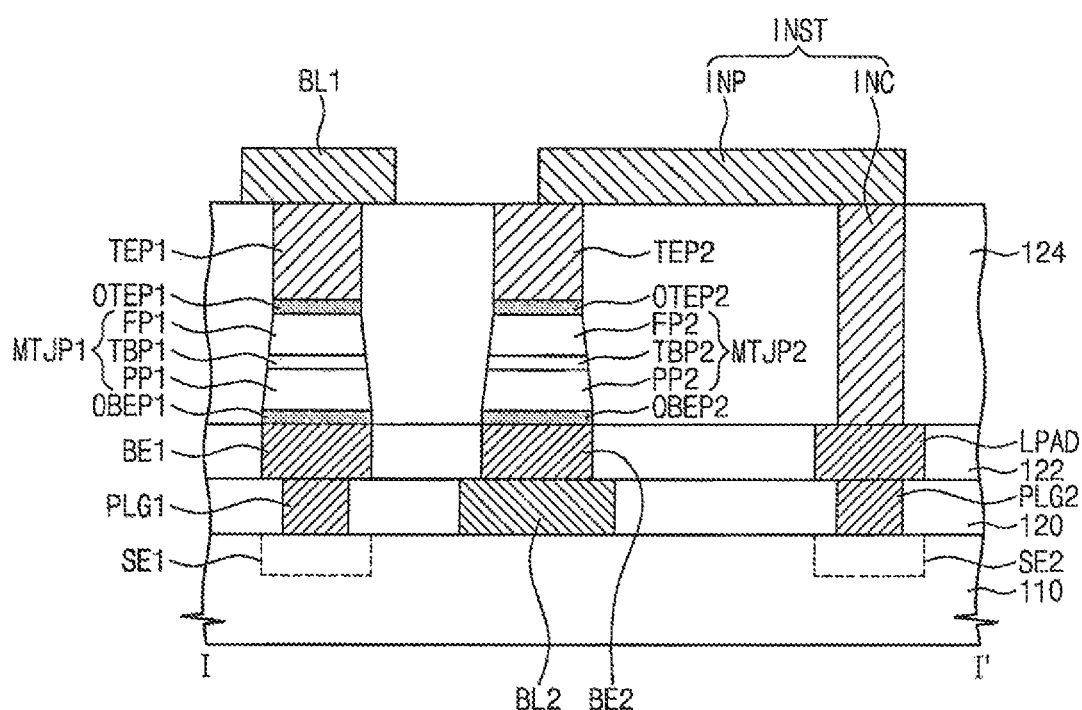
FIG. 5 is a cross-sectional view taken along a line I-I' of FIG. 4.

FIG. 4 is a plan view illustrating a unit memory cell of a magnetic memory device according to some embodiments of the inventive concepts. For example, FIG. 4 may is a plan view illustrating an embodiment of the unit memory cell described with reference to FIGS. 2 and 3. FIG. 5 is a cross-sectional view taken along a line I-I' of FIG. 4.

Referring to FIGS. 4 and 5, a substrate 110 may be provided. The substrate 110 may include first and second selection transistors SE1 and SE2. The first and second selection transistors SE1 and SE2 may be controlled by one word line (not shown). In addition, a source line (not shown) may be further provided to be connected in common to a source region of the first selection transistor SE1 and a source region of the second selection transistor SE2.

A first interlayer insulating layer 120 may be provided on the substrate 110. For example, the first interlayer insulating layer 120 may include at least one of silicon oxide, silicon nitride, or silicon oxynitride.

First and second contact plugs PLG1 and PLG2 and a second bit line BL2 may be provided on the substrate 110. The first contact plug PLG1 may penetrate the first interlayer insulating layer 120 so as to be connected to a drain region of the first selection transistor SE1. The second contact plug PLG2 may penetrate the first interlayer insulating layer 120 so as to be connected to a drain region of the second selection transistor SE2. The second bit line BL2 may be disposed in the first interlayer insulating layer 120 and may extend in a first direction D1. The first and second contact plugs PLG1 and PLG2 and the second bit line BL2 may be disposed at the substantially same level. As used in the present specification, the term 'level" means a height from a top surface of the substrate 110. The first and second contact plugs PLG1 and PLG2 and the second bit line BL2 may include a conductive material.

A second interlayer insulating layer 122 may be provided on the first interlayer insulating layer 120. For example, the second interlayer insulating layer 122 may include at least one of silicon oxide, silicon nitride, or silicon oxynitride.

First and second bottom electrodes BE1 and BE2 and a landing pad LPAD may be provided. The first bottom electrode BE1 may penetrate the second interlayer insulating layer 122 so as to be electrically connected to the first contact plug PLG1, and the second bottom electrode BE2 may penetrate the second interlayer insulating layer 122 so as to be electrically connected to the second bit line BL2. The landing pad LPAD may penetrate the second interlayer insulating layer 122 so as to be electrically connected to the second contact plug PLG2. Top surfaces of the first and second bottom electrodes BE1 and BE2 and a top surface of the landing pad LPAD may be disposed at the substantially same level. Each of the first and second bottom electrodes BE1 and BE2 and the landing pad LPAD may include a conductive material. For example, each of the first and second bottom electrodes BE1 and BE2 and the landing pad LPAD may include a metal such as copper, aluminum, tungsten, or titanium.

A first optional bottom electrode pattern OBEP1, a first magnetic tunnel junction pattern MTJP1, a first optional top electrode pattern OTEP1, and a first top electrode pattern TEP1 may be sequentially stacked on the first bottom electrode BE1. A second optional bottom electrode pattern OBEP2, a second magnetic tunnel junction pattern MTJP2, a second optional top electrode pattern OTEP2, and a second top electrode pattern TEP2 may be sequentially stacked on the second bottom electrode BE2. Thus, a bottom surface of the first magnetic tunnel junction pattern MTJP1 may be electrically connected to the first selection transistor SE1 through the first bottom electrode BE1 and the first contact plug PLG1, and a bottom surface of the second magnetic tunnel junction pattern MTJP2 may be electrically connected to the second bit line BL2 through the second bottom electrode BE2.

The first and second optional bottom electrode patterns OBEP1 and OBEP2 and the first and second optional top electrode patterns OTEP1 and OTEP2 may include, for example, a conductive metal nitride such as titanium nitride and/or tantalum nitride. The first and second top electrode patterns TEP1 and TEP2 may include, for example, at least one of tungsten, tantalum, aluminum, copper, gold, silver, titanium, or a conductive metal nitride including at least one thereof.

The first magnetic tunnel junction pattern MTJP1 may include a first free pattern FP1, a first pinned pattern PP1, and a first tunnel barrier pattern TBP1 disposed between the first free pattern FP1 and the first pinned pattern PP1. Likewise, the second magnetic tunnel junction pattern MTJP2 may include a second free pattern FP2, a second pinned pattern PP2, and a second tunnel barrier pattern TBP2 disposed between the second free pattern FP2 and the second pinned pattern PP2. A stacking order of the first free pattern FP1, the first pinned pattern PP1, and the first tunnel barrier pattern TBP1 may be the same as a stacking order of the second free pattern FP2, the second pinned pattern PP2, and the second tunnel barrier pattern TBP2.

In some embodiments, as illustrated in FIG. 5, the first pinned pattern PP1, the first tunnel barrier pattern TBP1, and the first free pattern FP1 may be sequentially stacked, and the second pinned pattern PP2, the second tunnel barrier pattern TBP2, and the second free pattern FP2 may be sequentially stacked. However, embodiments of the inventive concepts are not limited thereto. Alternatively, unlike FIG. 5, the first free pattern FP1, the first tunnel barrier pattern TBP1, and the first pinned pattern PP1 may be sequentially stacked, and the second free pattern FP2, the second tunnel barrier pattern TBP2, and the second pinned pattern PP2 may be sequentially stacked. Hereinafter, the embodiment illustrated in FIG. 5 will be described as an example for the purpose of ease and convenience in explanation. The first and second magnetic tunnel junction patterns MTJP1 and MTJP2 will be described later in more detail with reference to FIGS. 9A and/or 9B.

As described with reference to FIG. 3, the first pinned pattern PP1 may be electrically connected to the drain region of the first selection transistor SE1 through the first bottom electrode BE1 and the first contact plug PLG1. The second pinned pattern PP2 may be electrically connected to the second bit line BL2 through the second bottom electrode BE2.

A distance d1 between the landing pad LPAD and the first magnetic tunnel junction pattern MTJP1 may be greater than a distance d3 between the first and second magnetic tunnel junction patterns MTJP1 and MTJP2 when viewed from a plan view. In addition, a distance d2 between the landing pad LPAD and the second magnetic tunnel junction pattern MTJP2 may be greater than the distance d3 between the first and second magnetic tunnel junction patterns MTJP1 and MTJP2 when viewed from a plan view.

In some embodiments, as illustrated in FIG. 4, the first magnetic tunnel junction pattern MTJP1, the second magnetic tunnel junction pattern MTJP2, and the landing pad LPAD may be arranged in a line along a second direction D2 perpendicular to the first direction D1. However, embodiments of the inventive concepts are not limited thereto.

The first and second magnetic tunnel junction patterns MTJP1 and MTJP2 may be formed by patterning a magnetic tunnel junction layer, as described later with reference to FIGS. 8A to 8C. During the process of patterning the magnetic tunnel junction layer, etch by-products may be generated from the magnetic tunnel junction layer and may be then re-deposited on sidewalls of the first and second magnetic tunnel junction patterns MTJP1 and MTJP2. Thus, the first and second magnetic tunnel junction patterns MTJP1 and MTJP2 may be short-circuited. The probability of the magnetic tunnel junction patterns MTJP1 and MTJP2 becoming short-circuited may increase as the distance d3 between the first and second magnetic tunnel junction patterns MTJP1 and MTJP2 decreases. The distance d3 between the first and second magnetic tunnel junction patterns MTJP1 and MTJP2 may be substantially equal to or greater than a minimum spacing distance substantially capable of preventing the magnetic tunnel junction patterns from being short-circuited by the etch by-products generated during patterning of the magnetic tunnel junction layer.

In addition, a landing pad may be exposed and partially etched during a patterning process of forming a magnetic tunnel junction pattern. Etch by-products generated from the etching of the landing pad may be re-deposited on a sidewall of the magnetic tunnel junction pattern, thereby causing a short of the magnetic tunnel junction pattern. The probability of the magnetic tunnel junction pattern becoming short-circuited due to the etching of the landing pad may increase as a distance between the magnetic tunnel junction pattern and the landing pad decreases.

According to embodiments of the inventive concepts, the distance d1 between the landing pad LPAD and the first magnetic tunnel junction pattern MTJP1 and the distance d2 between the landing pad LPAD and the second magnetic tunnel junction pattern MTJP2 may be greater than the distance d3 between the first and second magnetic tunnel junction patterns MTJP1 and MTJP2 when viewed from a plan view. Thus, even if the landing pad LPAD is exposed during the process of forming the first and second magnetic tunnel junction patterns MTJP1 and MTJP2, it may be possible to reduce or minimize the probability that the etch by-products generated from the etching of the landing pad LPAD will be re-deposited on the sidewalls of the magnetic tunnel junction patterns MTJP1 and MTJP2. As a result, according to embodiments of the inventive concepts, it may be possible to substantially prevent or inhibit the magnetic tunnel junction patterns MTJP1 and MTJP2 from being short-circuited by the etch by-products of the landing pad LPAD, and thus reliability of the magnetic memory device may be improved.

A third interlayer insulating layer 124 may be provided on the second interlayer insulating layer 122 to cover the first and second magnetic tunnel junction patterns MTJP1 and MTJP2. The third interlayer insulating layer 124 may include, for example, at least one of silicon oxide, silicon nitride, or silicon oxynitride.

An interconnection contact INC may penetrate the third interlayer insulating layer 124 so as to be electrically connected to the landing pad LPAD. The interconnection contact INC may include a conductive material. The interconnection contact INC may include, for example, a metal such as copper, aluminum, tungsten, or titanium.

A first bit line BL1 and an interconnection pattern INP may be provided on the third interlayer insulating layer 124. The first bit line BL1 may be electrically connected to the first top electrode pattern TEP1 and may extend in the first direction D1. The interconnection pattern INP may electrically connect the interconnection contact INC to the second top electrode pattern TEP2. The interconnection pattern INP and the interconnection contact INC may constitute an interconnection structure INST. Thus, as described with reference to FIG. 3, a top surface (i.e., the first free pattern FP1) of the first magnetic tunnel junction pattern MTJP1 may be electrically connected to the first bit line BL1 through the first top electrode pattern TEP1. In addition, a top surface (i.e., the second free pattern FP2) of the second magnetic tunnel junction pattern MTJP2 may be electrically connected to the drain region of the second selection transistor SE2 through the second top electrode pattern TEP2, the interconnection structure INST, the landing pad LPAD, and the second contact plug PLG2. Each of the first bit line BL1 and the interconnection pattern INP may include a conductive material. For example, each of the first bit line BL1 and the interconnection pattern INP may include a metal such as copper, aluminum, tungsten, or titanium.

Figure 6:
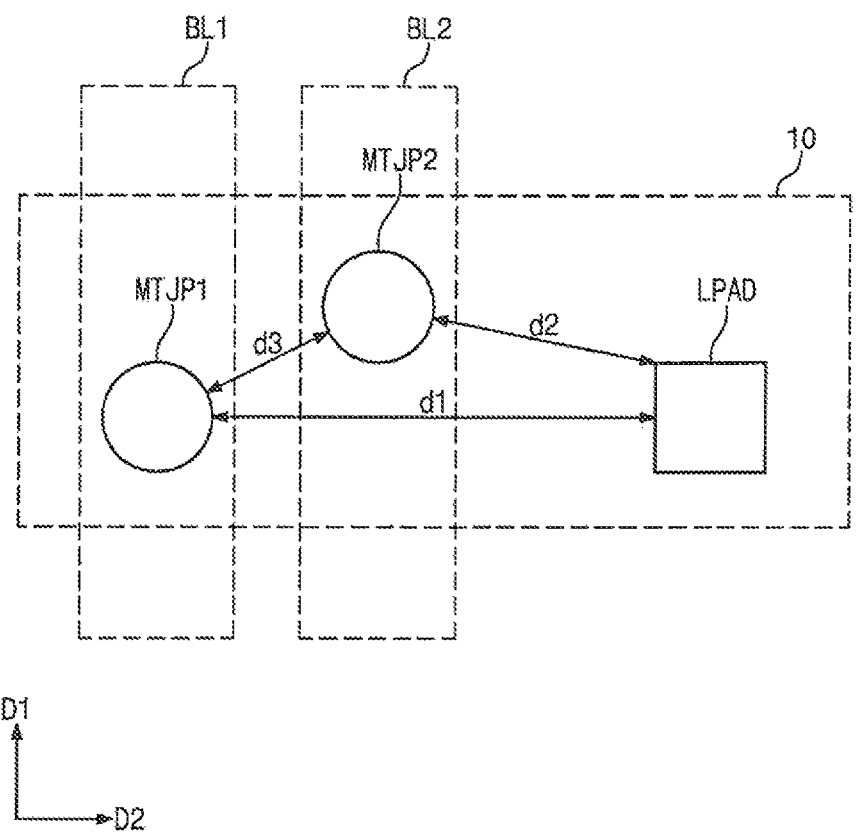
FIG. 6 is a plan view illustrating a unit memory cell of a magnetic memory device according to some embodiments of the inventive concepts.

FIG. 6 is a plan view illustrating a unit memory cell of a magnetic memory device according to some embodiments of the inventive concepts. For example, FIG. 6 is a plan view illustrating an embodiment of the unit memory cell described with reference to FIGS. 2 and 3. In the embodiments of FIG. 6, the substantially same elements as described with reference to FIGS. 4 and 5 will be indicated by the same reference numbers or the same reference designators, and the descriptions thereto will be omitted or mentioned briefly for the purpose of ease and convenience in explanation.

Other than the planar arrangement of the first and second magnetic tunnel junction patterns MTJP1 and MTJP2 and the landing pad LPAD, other features of a unit memory cell 10 illustrated in FIG. 6 may be substantially similar to corresponding features of the unit memory cell 10 described with reference to FIGS. 4 and 5. Thus, the planar arrangement of the first and second magnetic tunnel junction patterns MTJP1 and MTJP2 and the landing pad LPAD will be primarily described hereinafter.

Referring to FIG. 6, a distance d1 between the landing pad LPAD and the first magnetic tunnel junction pattern MTJP1 may be greater than a distance d3 between the first and second magnetic tunnel junction patterns MTJP1 and MTJP2 when viewed from a plan view. In addition, a distance d2 between the landing pad LPAD and the second magnetic tunnel junction pattern MTJP2 may be greater than the distance d3 between the first and second magnetic tunnel junction patterns MTJP1 and MTJP2 when viewed from a plan view.

The first magnetic tunnel junction pattern MTJP1, the second magnetic tunnel junction pattern MTJP2, and the landing pad LPAD may not be arranged in a line. For example, as illustrated in FIG. 6, the first magnetic tunnel junction pattern MTJP1 and the landing pad LPAD may be arranged in the second direction D2 to constitute a row, and the second magnetic tunnel junction pattern MTJP2 may be offset from the row in the first direction D1, such that the first magnetic tunnel junction pattern MTJP1, the second magnetic tunnel junction pattern MTJP2 and the landing pad LPAD of a single memory cell form a triangular shape.

The first and second magnetic tunnel junction patterns MTJP1 and MTJP2 may be formed by patterning a magnetic tunnel junction layer (not shown). During the patterning process of the magnetic tunnel junction layer, etch by-products generated from the magnetic tunnel junction layer may be re-deposited on sidewalls of the first and second magnetic tunnel junction patterns MTJP1 and MTJP2 which can cause the first and second magnetic tunnel junction patterns MTJP1 and MTJP2 to become short-circuited. The probability of the magnetic tunnel junction patterns MTJP1 and MTJP2 being short-circuited may increase as the distance d3 between the first and second magnetic tunnel junction patterns MTJP1 and MTJP2 decreases. The distance d3 between the first and second magnetic tunnel junction patterns MTJP1 and MTJP2 may be substantially equal to or greater than a minimum spacing distance capable of substantially preventing the magnetic tunnel junction patterns from being short-circuited by the etch by-products generated from the magnetic tunnel junction layer.

According to embodiments of the inventive concepts, the distance d1 between the landing pad LPAD and the first magnetic tunnel junction pattern MTJP1 and the distance d2 between the landing pad LPAD and the second magnetic tunnel junction pattern MTJP2 may be greater than the distance d3 between the first and second magnetic tunnel junction patterns MTJP1 and MTJP2 when viewed from a plan view. Thus, even if the landing pad LPAD is exposed during the patterning process of forming the first and second magnetic tunnel junction patterns MTJP1 and MTJP2, it is possible to reduce or minimize the probability that the etch by-products generated from the landing pad LPAD will be re-deposited on the sidewalls of the magnetic tunnel junction patterns MTJP1 and MTJP2. In other words, according to embodiments of the inventive concepts, it is possible to substantially prevent or inhibit the magnetic tunnel junction patterns MTJP1 and MTJP2 from being short-circuited by the etch by-products generated by etching the landing pad LPAD, and thus reliability of the magnetic memory device may be improved.

FIGS. 7A to 7E are plan views illustrating memory cell arrays of magnetic memory devices according to some embodiments of the inventive concepts. For example, FIGS. 7A to 7E may be plan views illustrating embodiments of the memory cell array described with reference to FIG. 2.

Figure 7A:
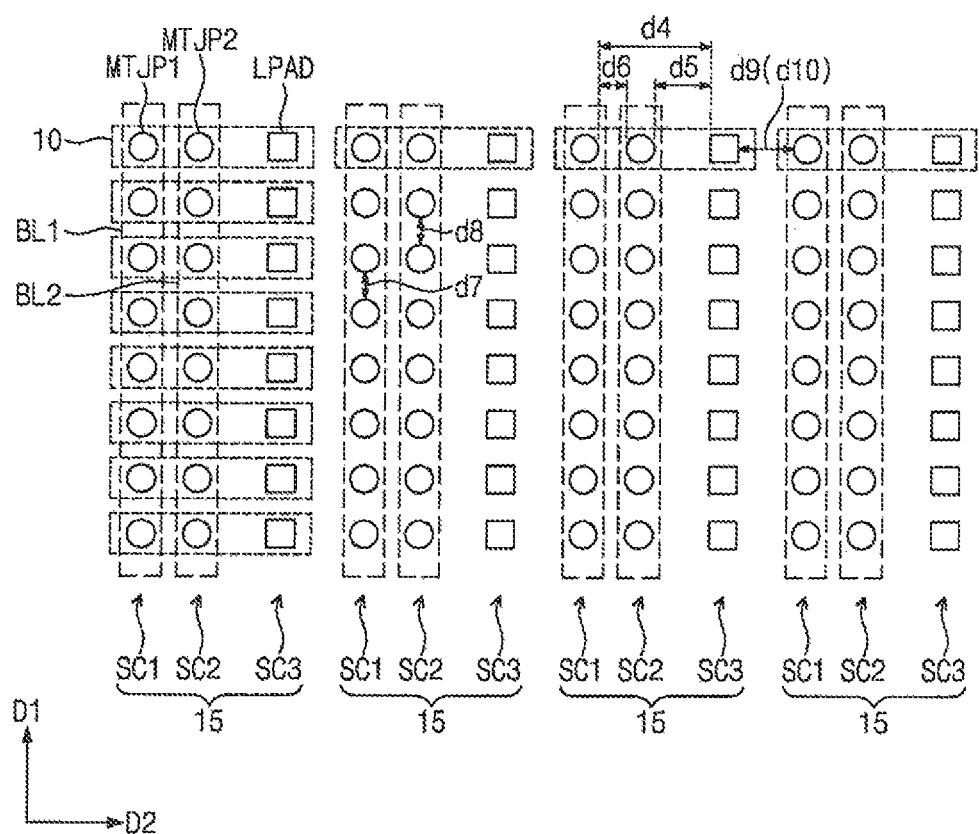
FIGS. 7A to 7E are plan views illustrating memory cell arrays of magnetic memory devices according to some embodiments of the inventive concepts.

Referring to FIG. 7A, a memory cell array according to some embodiments of the inventive concepts may include a plurality of unit memory cells 10 that are arranged in two-dimensions. Each of the unit memory cells 10 may be substantially similar to the unit memory cell described with reference to FIGS. 4 and 5. Thus, a detailed description of each of the unit memory cells 10 will be omitted for the purpose of ease and convenience in explanation. This planar arrangement of the unit memory cells 10 (or the magnetic tunnel junction patterns and landing pads included therein) will be mainly described hereinafter.

Referring to FIGS. 4, 5, and 7A, the two-dimensionally arranged unit memory cells 10 may be divided into a plurality of memory columns 15. Each of the memory columns 15 may include a plurality of the unit memory cells 10 arranged along the first direction D1, and the memory columns 15 may be arranged in the second direction D2.

Each of the memory columns 15 may include a first sub-column SC1 including the first magnetic tunnel junction patterns MTJP1 arranged in the first direction D1, a second sub-column SC2 including the second magnetic tunnel junction patterns MTJP2 arranged in the first direction D1, and a third sub-column SC3 including the landing pads LPAD arranged in the first direction D1. The second sub-column SC2 may be disposed between the first sub-column SC1 and the third sub-column SC3 in each of the memory columns 15.

A distance d4 in the second direction D2 between the first sub-column SC1 and the third sub-column SC3 may be greater than a distance d6 in the second direction D2 between the first sub-column SC1 and the second sub-column SC2, and a distance d5 in the second direction D2 between the second sub-column SC2 and the third sub-column SC3 may be greater than the distance d6 in the second direction D2 between the first sub-column SC1 and the second sub-column SC2.

The first magnetic tunnel junction patterns MTJP1 included in the first sub-column SC1 may be spaced apart from each other in the first direction D1 and may be arranged in the first direction D1. Likewise, the second magnetic tunnel junction patterns MTJP2 included in the second sub-column SC2 may be spaced apart from each other in the first direction D1 and may be arranged in the first direction D1. In some embodiments, a distance d7 in the first direction D1 between the first magnetic tunnel junction patterns MTJP1 and a distance d8 in the first direction D1 between the second magnetic tunnel junction patterns MTJP2 may be smaller than the distance d2 (FIG. 4) between the landing pad LPAD and the second magnetic tunnel junction pattern MTJP2 in the second sub-column SC2.

According to some embodiments, the distance d7 in the first direction D1 between the first magnetic tunnel junction patterns MTJP1 may be substantially equal to the distance d8 in the first direction D1 between the second magnetic tunnel junction patterns MTJP2. In addition, the distances d7 and d8 may be substantially equal to the distance d3 (FIG. 4) between the first and second magnetic tunnel junction patterns MTJP1 and MTJP2 (d3=d7=d8). In this case, the magnetic tunnel junction patterns MTJP1 and MTJP2 included in one memory column 15 may be arranged in the first and second directions D1 and D2 at substantially equal distances. As described with reference to FIG. 4, the distance d3 between the first and second magnetic tunnel junction patterns MTJP1 and MTJP2 may be substantially equal to or greater than the minimum spacing distance substantially capable of preventing the magnetic tunnel junction patterns from being short-circuited by the etch by-products generated from the magnetic tunnel junction layer. Thus, the distances between the magnetic tunnel junction patterns MTJP1 and MTJP2 included in one memory column 15 may be substantially equal to or greater than the minimum spacing distance substantially capable of preventing the magnetic tunnel junction patterns from being short-circuited by the etch by-products generated from the magnetic tunnel junction layer.

According to the embodiment illustrated in FIG. 7A, the first to third sub-columns SC1, SC2, and SC3 may be arranged in the same order in each of the memory columns 15. In detail, the first sub-column SC1, the second sub-column SC2, and the third sub-column SC3 may be arranged along the second direction D2 in the order named in each of the memory columns 15. Thus, the third sub-column SC3 of one of two adjacent memory columns 15 may be adjacent to the first sub-column SC1 of the other of the two adjacent memory columns 15 with a boundary, between the two adjacent memory columns 15, interposed therebetween. A distance d9 in the second direction D2 between the third and first sub-columns SC3 and SC1 adjacent to each other with the boundary interposed therebetween may be greater than the distance d6 in the second direction D2 between the first and second sub-columns SC1 and SC2 included in one memory column 15. For example, the distance d9 in the second direction D2 between the third sub-column SC3 and the first sub-column SC1 adjacent to each other with the boundary interposed therebetween may be substantially equal to the distance d5 in the second direction D2 between the second and third sub-columns SC2 and SC3 included in one memory column 15. Likewise, the minimum distance d10 between the landing pad LPAD and the first magnetic tunnel junction pattern MTJP1 respectively included in the third and first sub-columns SC3 and SC1 adjacent to each other with the boundary interposed therebetween may be greater than the distance d3 between the first and second magnetic tunnel junction patterns MTJP1 and MTJP2. For example, the minimum distance d10 may be substantially equal to the distance d2 between the second magnetic tunnel junction pattern MTJP2 and the landing pad LPAD.

According to the embodiments illustrated in FIGS. 4, 5, and 7A, the distance d10 or d2 between the landing pad LPAD and the magnetic tunnel junction pattern MTJP1 or MTJP2 adjacent to each other may be greater than the distance d3 between the first and second magnetic tunnel junction patterns MTJP1 and MTJP2 when viewed from a plan view. Thus, even if the landing pads LPAD are exposed during the patterning process for forming the magnetic tunnel junction patterns MTJP1 and MTJP2, it may be possible to reduce or minimize the probability that the etch by-products generated from the landing pads LPAD will be re-deposited on the sidewalls of the magnetic tunnel junction patterns MTJP1 and MTJP2. In other words, according to embodiments of the inventive concepts, it is possible to substantially prevent or inhibit the magnetic tunnel junction patterns MTJP1 and MTJP2 from being short-circuited by the etch by-products of the landing pads LPAD, and thus reliability of the magnetic memory device may be improved.

Referring to FIG. 5, the first bit lines BL1 extending in the first direction D1 may be provided. Each of the first bit lines BL1 may be connected in common to the first magnetic tunnel junction patterns MTJP1 included in each of the memory columns 15. In more detail, each of the first bit lines BL1 may be provided on the first magnetic tunnel junction patterns MTJP1 included in a corresponding first sub-column SC1 so as to be connected in common to the first magnetic tunnel junction patterns MTJP1 included in the corresponding first sub-column SC1. In addition, the second bit lines BL2 extending in the first direction D may be provided. Each of the second bit lines BL2 may be connected in common to the second magnetic tunnel junction patterns MTJP2 included in each of the memory columns 15. In more detail, each of the second bit lines BL2 may be provided under the second magnetic tunnel junction patterns MTJP2 included in a corresponding second sub-column SC2 so as to be connected in common to the second magnetic tunnel junction patterns MTJP2 included in the corresponding second sub-column SC2. As illustrated in FIG. 5, the first and second magnetic tunnel junction patterns MTJP1 and MTJP2 may be disposed at the same level. Thus, the first bit lines BL1 may be disposed at a higher level than the second bit lines BL2.

Figure 7B:
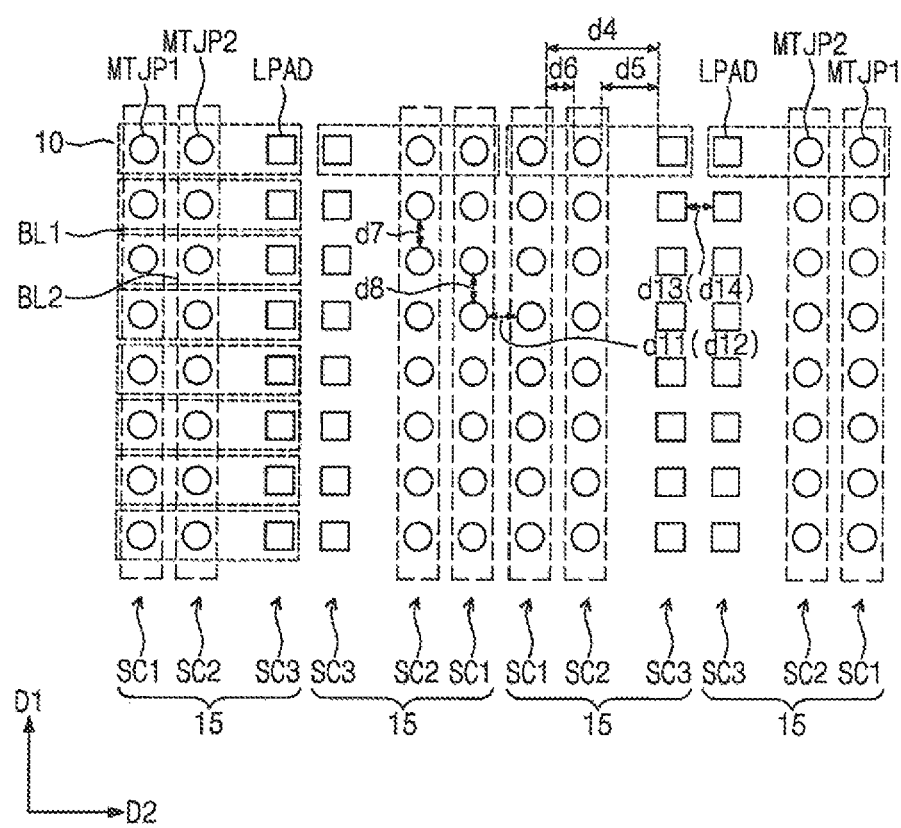

Referring to FIG. 7B, a memory cell array according to some embodiments of the inventive concepts may include a plurality of unit memory cells 10 that are arranged in a two-dimensional layout. Each of the unit memory cells 10 may be substantially similar to the unit memory cell described with reference to FIGS. 4 and 5. Thus, a detailed description of each of the unit memory cells 10 will be omitted for the purpose of ease and convenience in explanation. The planar arrangement of the unit memory cells 10 (or the magnetic tunnel junction patterns and landing pads included therein) will be primarily described hereinafter.

Referring to FIGS. 4, 5, and 7B, the two-dimensionally arranged unit memory cells 10 may be divided into a plurality of memory columns 15. Each of the memory columns 15 may include a plurality of the unit memory cells 10 arranged along the first direction D1, and the memory columns 15 may be arranged in the second direction D2 perpendicular to the first direction D1.

Each of the memory columns 15 may be similar to the memory column described with reference to FIGS. 4, 5, and 7A. Each of the memory columns 15 may include the first sub-column SC1 including the first magnetic tunnel junction patterns MTJP1 arranged in the first direction D1, the second sub-column SC2 including the second magnetic tunnel junction patterns MTJP2 arranged in the first direction D1, and the third sub-column SC3 including the landing pads LPAD arranged in the first direction D1. The detailed descriptions to each of the first to third sub-columns SC1, SC2, and SC3 will be omitted for the purpose of ease and convenience in explanation.

According to the embodiment illustrated in FIG. 7B, the first to third sub-columns SC1 to SC3 of one of two adjacent memory columns 15 and the first to third sub-columns SC1 to SC3 of the other of the two adjacent memory columns 15 may be symmetrical with respect to a boundary between the two adjacent memory columns 15. In detail, the first, second, and third sub-columns SC1, SC2, and SC3 of one of the two adjacent memory columns 15 may be arranged in the second direction D2 in the order named, but the first, second, and third sub-columns SC1, SC2, and SC3 of the other of the two adjacent memory columns 15 may be arranged in the second direction D2 in reverse order. In other word, the memory columns 15 may be arranged along the second direction D2 in mirror symmetry.

A first boundary of boundaries between the memory columns 15 may be adjacent to the first sub-columns SC1 respectively included in a pair of memory columns 15 adjacent to each other with the first boundary interposed therebetween. In other word, the first sub-columns SC1 of the pair of memory columns 15 may be adjacent to each other with the first boundary interposed therebetween. A distance d11 in the second direction D2 between the first sub-columns SC1 adjacent to each other with the first boundary interposed therebetween may be smaller than the distance d5 in the second direction D2 between the second and third sub-columns SC2 and SC3 included in one memory column 15. For example, the distance d11 in the second direction D2 between the first sub-columns SC1 may be substantially equal to the distance d6 in the second direction D2 between the first and second sub-columns SC1 and SC2 included in one memory column 15. Likewise, the minimum distance d12 between the first magnetic tunnel junction patterns MTJP1 respectively included in the first sub-columns SC that are adjacent to each other with the first boundary interposed therebetween may be smaller than the distance d2 (FIG. 4) between the landing pad LPAD and the second magnetic tunnel junction pattern MTJP2. For example, the minimum distance d12 may be substantially equal to the distance d3 (FIG. 4) between the first and second magnetic tunnel junction patterns MTJP1 and MTJP2.

A second boundary of the boundaries between the memory columns 15 may be adjacent to the third sub-columns SC3 respectively included in another pair of memory columns 15 adjacent to each other with the second boundary interposed therebetween. In other words, the third sub-columns SC3 of the another pair of memory columns 15 may be adjacent to each other with the second boundary interposed therebetween. A distance d13 in the second direction D2 between the third sub-columns SC3 adjacent to each other with the second boundary interposed therebetween may be smaller than the distance d5 in the second direction D2 between the second and third sub-columns SC2 and SC3 included in one memory column 15. In addition, the distance d13 in the second direction D2 between the adjacent third sub-columns SC3 may also be smaller than the distance d6 in the second direction D2 between the first and second sub-columns SC1 and SC2 included in one memory column 15. Likewise, the minimum distance d14 between the landing pads LPAD respectively included in the third sub-columns SC3 adjacent to each other with the second boundary interposed therebetween may be smaller than the distance d2 between the landing pad LPAD and the second magnetic tunnel junction pattern MTJP2. In addition, the minimum distance d14 may also be smaller than the distance d3 between the first and second magnetic tunnel junction patterns MTJP1 and MTJP2.

According to the embodiments illustrated in FIGS. 4, 5, and 7B, the distance d2 between the landing pad LPAD and the second magnetic tunnel junction pattern MTJP2 adjacent to each other may be greater than the distance d3 between the first and second magnetic tunnel junction patterns MTJP1 and MTJP2 when viewed from a plan view. Thus, even if the landing pads LPAD are exposed during the patterning process for forming the magnetic tunnel junction patterns MTJP1 and MTJP2, it is possible to reduce or minimize the probability that the etch by-products generated from the landing pads LPAD will be re-deposited on the sidewalls of the magnetic tunnel junction patterns MTJP1 and MTJP2. In other words, according to embodiments of the inventive concepts, it is possible to substantially prevent or inhibit the magnetic tunnel junction patterns MTJP1 and MTJP2 from being short-circuited by the etch by-products of the landing pads LPAD, and thus reliability of the magnetic memory device may be improved.

The first bit lines BL1 extending in the first direction D1 may be provided. Each of the first bit lines BL1 may be connected in common to the first magnetic tunnel junction patterns MTJP1 included in each of the memory columns 15. In addition, the second bit lines BL2 extending in the first direction D1 may be provided. Each of the second bit lines BL2 may be connected in common to the second magnetic tunnel junction patterns MTJP2 included in each of the memory columns 15. The first and second bit lines BL1 and BL2 may be substantially similar to those described with reference to FIGS. 4, 5, and 7A.

Figure 7C:
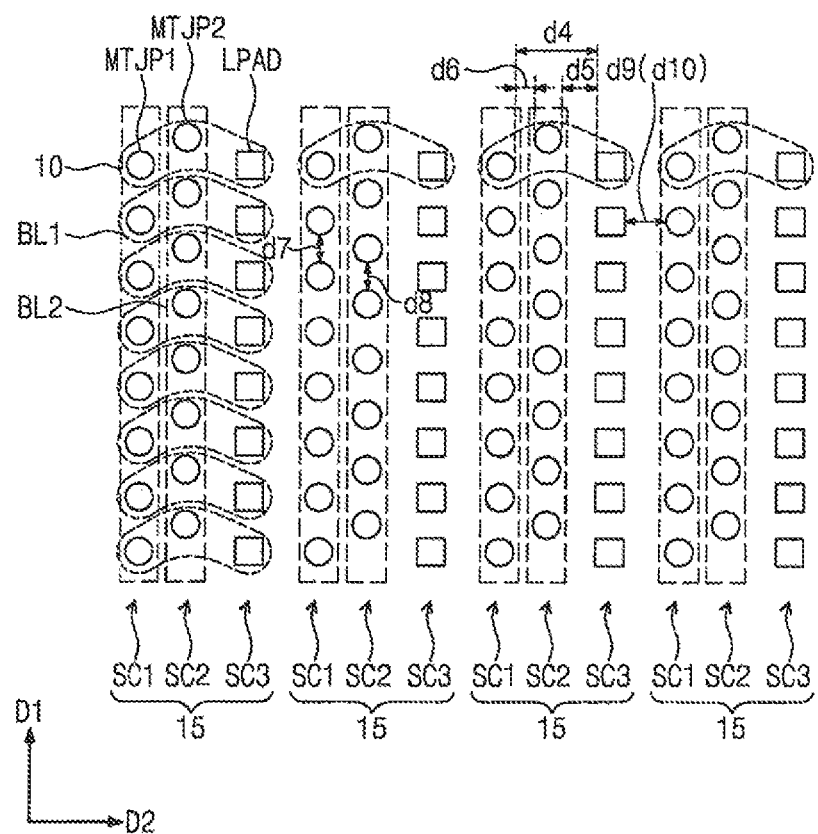

Referring to FIG. 7C, a memory cell array according to some embodiments of the inventive concepts may include a plurality of unit memory cells 10 that are two-dimensionally arranged. Each of the unit memory cells 10 may be substantially similar to the unit memory cell described with reference to FIG. 6. Thus, a detailed description of each of the unit memory cells 10 will be omitted for the purpose of ease and convenience in explanation. Planar arrangement of the unit memory cells 10 (or the magnetic tunnel junction patterns and landing pads included therein) will be mainly described hereinafter.

Referring to FIGS. 6 and 7C, the two-dimensionally arranged unit memory cells 10 may be divided into a plurality of memory columns 15. Each of the memory columns 15 may include a plurality of the unit memory cells 10 arranged along the first direction D1, and the memory columns 15 may be arranged in the second direction D2 that is perpendicular to the first direction D1.

Each of the memory columns 15 may include a first sub-column SC1 including the first magnetic tunnel junction patterns MTJP1 arranged in the first direction D1, a second sub-column SC2 including the second magnetic tunnel junction patterns MTJP2 arranged in the first direction D1, and a third sub-column SC3 including the landing pads LPAD arranged in the first direction D1.

A distance d4 in the second direction D2 between the first and third sub-columns SC1 and SC3 included in one memory column 15 may be greater than a distance d6 in the second direction D2 between the first and second sub-columns SC1 and SC2 included in one memory column 15 when viewed from a plan view. In addition, a distance d5 in the second direction D2 between the second and third sub-columns SC2 and SC3 included in one memory column 15 may be greater than the distance d6 in the second direction D2 between the first and second sub-columns SC1 and SC2 included in one memory column 15 when viewed from a plan view.

The first magnetic tunnel junction patterns MTJP1 included in the first sub-column SC1 may be spaced apart from each other in the first direction D1 and may be arranged in the first direction D1. Likewise, the second magnetic tunnel junction patterns MTJP2 included in the second sub-column SC2 may be spaced apart from each other in the first direction D1 and may be arranged in the first direction D1. A distance d7 in the first direction D1 between the first magnetic tunnel junction patterns MTJP1 and a distance d8 in the first direction D1 between the second magnetic tunnel junction patterns MTJP2 may be smaller than the distance d2 between the landing pad LPAD and the second magnetic tunnel junction pattern MTJP2. In each of the memory columns 15, the second sub-column SC2 may be disposed between the first sub-column SC1 and the third sub-column SC3.

According to the embodiments illustrated in FIG. 7C, the first magnetic tunnel junction patterns MTJP1 and the second magnetic tunnel junction patterns MTJP2 included in the first and second sub-columns SC1 and SC2 of one memory column 15 may be arranged in a zigzag form along the first direction D1 when viewed from a plan view. Likewise, the second magnetic tunnel junction patterns MTJP2 and the landing pads LPAD included in the second and third sub-columns SC2 and SC3 of one memory column 15 may be arranged in a zigzag form along the first direction D1 when viewed from a plan view. Thus, the distance d5 in the second direction D2 between the second and third sub-columns SC2 and SC3 may be smaller than the distance d2 (FIG. 4) between the second magnetic tunnel junction pattern MTJP2 and the landing pad LPAD when viewed from a plan view. In addition, the distance d6 in the second direction D2 between the first and second sub-columns SC1 and SC2 may be smaller than the distance d3 (FIG. 4) between the first and second magnetic tunnel junction patterns MTJP1 and MTJP2 when viewed from a plan view.

According to some embodiments, the distance d7 in the first direction D1 between the first magnetic tunnel junction patterns MTJP1 may be substantially equal to the distance d8 in the first direction D1 between the second magnetic tunnel junction patterns MTJP2. In addition, the distances d7 and d8 may be substantially equal to the distance d3 (FIG. 4) between the first and second magnetic tunnel junction patterns MTJP1 and MTJP2 (i.e., d3=d7=d8). In other words, the magnetic tunnel junction patterns MTJP1 and MTJP2 included in one memory column 15 may be spaced apart from each other by substantially equal distances. As described above, the distance d3 between the first and second magnetic tunnel junction patterns MTJP1 and MTJP2 may be substantially equal to or greater than the minimum spacing distance substantially capable of preventing the magnetic tunnel junction patterns from being short-circuited by the etch by-products generated from the magnetic tunnel junction layer. Thus, the distances d3, d7, and d8 between the magnetic tunnel junction patterns MTJP1 and MTJP2 included in one memory column 15 may be substantially equal to or greater than the minimum spacing distance substantially capable of preventing the magnetic tunnel junction patterns from being short-circuited by the etch by-products generated from the magnetic tunnel junction layer.

According to the embodiment illustrated in FIGS. 6 and 7C, the first to third sub-columns SC1, SC2, and SC3 may be arranged in the same order in each of the memory columns 15. In detail, the first sub-column SC1, the second sub-column SC2, and the third sub-column SC3 may be arranged along the second direction D2 in the order named in each of the memory columns 15. Thus, the third sub-column SC3 of one of two adjacent memory columns 15 may be adjacent to the first sub-column SC1 of the other of the two adjacent memory columns 15 with a boundary, between the two adjacent memory columns 15, interposed therebetween. A distance d9 in the second direction D2 between the third and first sub-columns SC3 and SC1 adjacent to each other with the boundary interposed therebetween may be greater than the distance d6 in the second direction D2 between the first and second sub-columns SC1 and SC2 included in one memory column 15. The minimum distance d10 between the landing pad LPAD and the first magnetic tunnel junction pattern MTJP1 respectively included in the third and first sub-columns SC3 and SC1 adjacent to each other with the boundary interposed therebetween may be greater than the distance d3 (FIG. 4) between the first and second magnetic tunnel junction patterns MTJP1 and MTJP2. For example, the minimum distance d10 may be substantially equal to the distance d2 (FIG. 4) between the second magnetic tunnel junction pattern MTJP2 and the landing pad LPAD.

According to the embodiment illustrated in FIGS. 6 and 7C, the distance d10 or d2 between the landing pad LPAD and the magnetic tunnel junction pattern MTJP1 or MTJP2 adjacent to each other may be greater than the distance d3 (FIG. 4) between the first and second magnetic tunnel junction patterns MTJP1 and MTJP2 when viewed from a plan view. Thus, even if the landing pads LPAD are exposed during the patterning process for forming the magnetic tunnel junction patterns MTJP1 and MTJP2, it is possible to reduce or minimize the probability that the etch by-products generated from the landing pads LPAD will be re-deposited on the sidewalls of the magnetic tunnel junction patterns MTJP1 and MTJP2. In other words, according to embodiments of the inventive concepts, it is possible to substantially prevent or inhibit the magnetic tunnel junction patterns MTJP1 and MTJP2 from being short-circuited by the etch by-products of the landing pads LPAD, and thus reliability of the magnetic memory device may be improved.

The first bit lines BL1 extending in the first direction D1 may be provided. Each of the first bit lines BL1 may be connected in common to the first magnetic tunnel junction patterns MTJP1 included in each of the memory columns 15. In more detail, each of the first bit lines BL1 may be provided on the first magnetic tunnel junction patterns MTJP1 included in a corresponding first sub-column SC1 so as to be connected in common to the first magnetic tunnel junction patterns MTJP1 included in the corresponding first sub-column SC1. In addition, the second bit lines BL2 extending in the first direction D1 may be provided. Each of the second bit lines BL2 may be connected in common to the second magnetic tunnel junction patterns MTJP2 included in each of the memory columns 15. In more detail, each of the second bit lines BL2 may be provided under the second magnetic tunnel junction patterns MTJP2 included in a corresponding second sub-column SC2 so as to be connected in common to the second magnetic tunnel junction patterns MTJP2 included in the corresponding second sub-column SC2. As illustrated in FIG. 5, the first and second magnetic tunnel junction patterns MTJP1 and MTJP2 may be disposed at the same level. Thus, the first bit lines BL1 may be disposed at a higher level than the second bit lines BL2.

Figure 7D:
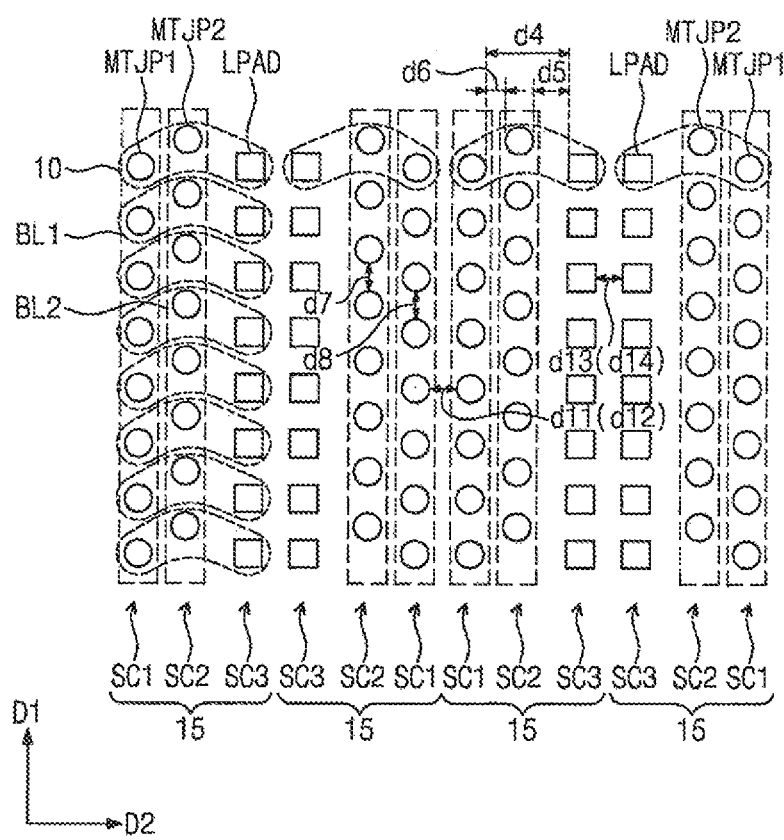

Referring to FIG. 7D, a memory cell array according to some embodiments of the inventive concepts may include a plurality of unit memory cells 10 two-dimensionally arranged. Each of the unit memory cells 10 may be substantially similar to the unit memory cell described with reference to FIG. 6. Thus, a detailed description of each of the unit memory cells 10 will be omitted for the purpose of ease and convenience in explanation. The planar arrangement of the unit memory cells 10 (or the magnetic tunnel junction patterns and landing pads included therein) will be primarily described hereinafter.

Referring to FIGS. 6 and 7D, the two-dimensionally arranged unit memory cells 10 may be divided into a plurality of memory columns 15. Each of the memory columns 15 may include a plurality of the unit memory cells 10 arranged along the first direction D1, and the memory columns 15 may be arranged in the second direction D2 perpendicular to the first direction D1.

Each of the memory columns 15 may be similar to the memory column described with reference to FIGS. 6 and 7C. In some embodiments, each of the memory columns 15 may include the first sub-column SC1 including the first magnetic tunnel junction patterns MTJP1 arranged in the first direction D1, the second sub-column SC2 including the second magnetic tunnel junction patterns MTJP2 arranged in the first direction D1, and the third sub-column SC3 including the landing pads LPAD arranged in the first direction D1. The detailed descriptions to each of the first to third sub-columns SC1, SC2, and SC3 will be omitted for the purpose of ease and convenience in explanation.

According to the embodiment illustrated in FIG. 7D, the first to third sub-columns SC1 to SC3 of one of two adjacent memory columns 15 and the first to third sub-columns SC1 to SC3 of the other of the two adjacent memory columns 15 may be symmetrical with respect to a boundary between the two adjacent memory columns 15. In detail, the first, second, and third sub-columns SC1, SC2, and SC3 of one of the two adjacent memory columns 15 may be arranged in the second direction D2 in the order named, but the first, second, and third sub-columns SC1, SC2, and SC3 of the other of the two adjacent memory columns 15 may be arranged in the second direction D2 in reverse order. In other word, the memory columns 15 may be arranged along the second direction D2 in mirror symmetry.

A first boundary of boundaries between the memory columns 15 may be adjacent to the first sub-columns SC1 respectively included in a pair of memory columns 15 adjacent to each other with the first boundary interposed therebetween. In other word, the first sub-columns SC1 of the pair of memory columns 15 may be adjacent to each other with the first boundary interposed therebetween. A distance d11 in the second direction D2 between the first sub-columns SC1 adjacent to each other with the first boundary interposed therebetween may be smaller than the distance d2 between the landing pad LPAD and the second magnetic tunnel junction pattern MTJP2. For example, the distance d11 may be substantially equal to the distance d3 between the first and second magnetic tunnel junction patterns MTJP1 and MTJP2. Likewise, the minimum distance d12 between the first magnetic tunnel junction patterns MTJP1 respectively included in the first sub-columns SC1 adjacent to each other with the first boundary interposed therebetween may be smaller than the distance d2 between the landing pad LPAD and the second magnetic tunnel junction pattern MTJP2. For example, the minimum distance d12 may be substantially equal to the distance d3 between the first and second magnetic tunnel junction patterns MTJP1 and MTJP2.

A second boundary of the boundaries between the memory columns 15 may be adjacent to the third sub-columns SC3 respectively included in another pair of memory columns 15 adjacent to each other with the second boundary interposed therebetween. In other word, the third sub-columns SC3 of the another pair of memory columns 15 may be adjacent to each other with the second boundary interposed therebetween. A distance d13 in the second direction D2 between the third sub-columns SC3 adjacent to each other with the second boundary interposed therebetween may be smaller than the distance d5 in the second direction D2 between the second and third sub-columns SC2 and SC3 included in one memory column 15. In addition, the distance d13 in the second direction D2 between the adjacent third sub-columns SC3 may also be smaller than the distance d6 in the second direction D2 between the first and second sub-columns SC1 and SC2 included in one memory column 15. Likewise, the minimum distance d14 between the landing pads LPAD respectively included in the third sub-columns SC3 adjacent to each other with the second boundary interposed therebetween may be smaller than the distance d2 between the landing pad LPAD and the second magnetic tunnel junction pattern MTJP2. In addition, the minimum distance d14 may also be smaller than the distance d3 between the first and second magnetic tunnel junction patterns MTJP1 and MTJP2.

According to the embodiments illustrated in FIGS. 6 and 7D, the distance d2 between the landing pad LPAD and the second magnetic tunnel junction pattern MTJP2 adjacent to each other may be greater than the distance d3 between the first and second magnetic tunnel junction patterns MTJP1 and MTJP2 when viewed from a plan view. Thus, even if the landing pads LPAD are exposed during the patterning process for forming the magnetic tunnel junction patterns MTJP1 and MTJP2, it is possible to substantially reduce or minimize the probability that the etch by-products generated from the landing pads LPAD will be re-deposited on the sidewalls of the magnetic tunnel junction patterns MTJP1 and MTJP2. In other words, according to embodiments of the inventive concepts, it is possible to substantially prevent or inhibit the magnetic tunnel junction patterns MTJP1 and MTJP2 from being short-circuited by the etch by-products of the landing pads LPAD, and thus reliability of the magnetic memory device may be improved.

Each of the first bit lines BL1 extending in the first direction D1 may be connected in common to the first magnetic tunnel junction patterns MTJP1 included in each of the memory columns 15. In addition, each of the second bit lines BL2 extending in the first direction D1 may be connected in common to the second magnetic tunnel junction patterns MTJP2 included in each of the memory columns 15. The first and second bit lines BL1 and BL2 may be substantially similar to those described with reference to FIG. 7A.

Figure 7E:
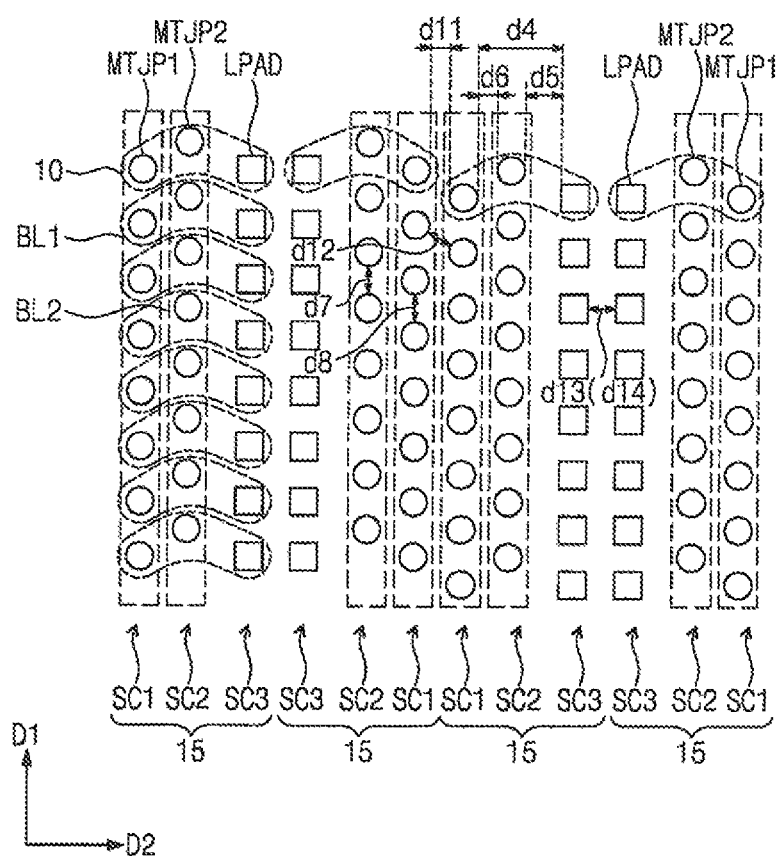

Referring to FIG. 7E, a memory cell array according to some embodiments of the inventive concepts may include a plurality of two-dimensionally arranged unit memory cells 10. Each of the unit memory cells 10 may be substantially similar to the unit memory cell described with reference to FIG. 6. Thus, a detailed description of each of the unit memory cells 10 will be omitted for the purpose of ease and convenience in explanation. The planar arrangement of the unit memory cells 10 (or the magnetic tunnel junction patterns and landing pads included therein) will be primarily described hereinafter.

Referring to FIGS. 6 and 7E, the unit memory cells 10 two-dimensionally arranged may be divided into a plurality of memory columns 15. Each of the memory columns 15 may include a plurality of the unit memory cells 10 arranged along the first direction D1, and the memory columns 15 may be arranged in the second direction D2 perpendicular to the first direction D1.

Each of the memory columns 15 may be similar to the memory column described with reference to FIGS. 6 and 7D. In detail, each of the memory columns 15 may include the first sub-column SC1 including the first magnetic tunnel junction patterns MTJP1 arranged in the first direction D1, the second sub-column SC2 including the second magnetic tunnel junction patterns MTJP2 arranged in the first direction D1, and the third sub-column SC3 including the landing pads LPAD arranged in the first direction D1. The detailed descriptions to each of the first to third sub-columns SC1, SC2, and SC3 will be omitted for the purpose of ease and convenience in explanation.

According to the embodiment illustrated in FIG. 7E, the first, second, and third sub-columns SC1, SC2, and SC3 of one of two memory columns 15 adjacent to each other may be arranged in the second direction D2 in the order named, but the first, second, and third sub-columns SC1, SC2, and SC3 of the other of the two adjacent memory columns 15 may be arranged in the second direction D2 in reverse order.

A first boundary of boundaries between the memory columns 15 may be adjacent to the first sub-columns SC1 respectively included in a pair of memory columns 15 adjacent to each other with the first boundary interposed therebetween. In other word, the first sub-columns SC1 of the pair of memory columns 15 may be adjacent to each other with the first boundary interposed therebetween. The first magnetic tunnel junction patterns MTJP1 included in the first sub-columns SC1 adjacent to each other with the first boundary interposed therebetween may be arranged in a zigzag from along the first direction D1 when viewed from a plan view. A distance d11 in the second direction D2 between the first sub-columns SC1 adjacent to each other with the first boundary interposed therebetween may be smaller than the distance d5 in the second direction D2 between the second and third sub-columns SC2 and SC3 included in one memory column 15. For example, the distance d11 may be substantially equal to the distance d6 in the second direction D2 between the first and second sub-columns SC1 and SC2 included in one memory column 15. The minimum distance d12 between the first magnetic tunnel junction patterns MTJP1 respectively included in the first sub-columns SC1 adjacent to each other with the first boundary interposed therebetween may be smaller than the distance d2 between the landing pad LPAD and the second magnetic tunnel junction pattern MTJP2. For example, the minimum distance d12 may be substantially equal to the distance d3 between the first and second magnetic tunnel junction patterns MTJP1 and MTJP2.

A second boundary of the boundaries between the memory columns 15 may be adjacent to the third sub-columns SC3 respectively included in another pair of memory columns 15 adjacent to each other with the second boundary interposed therebetween. In other word, the third sub-columns SC3 of the another pair of memory columns 15 may be adjacent to each other with the second boundary interposed therebetween. The distance d13 in the second direction D2 between the third sub-columns SC3 adjacent to each other with the second boundary interposed therebetween may be smaller than the distance d5 in the second direction D2 between the second and third sub-columns SC2 and SC3 included in one memory column 15. In addition, the distance d13 in the second direction D2 between the adjacent third sub-columns SC3 may also be smaller than the distance d6 in the second direction D2 between the first and second sub-columns SC1 and SC2 included in one memory column 15. Likewise, the minimum distance d14 between the landing pads LPAD respectively included in the third sub-columns SC3 adjacent to each other with the second boundary interposed therebetween may be smaller than the distance d2 between the landing pad LPAD and the second magnetic tunnel junction pattern MTJP2. In addition, the minimum distance d14 may also be smaller than the distance d3 between the first and second magnetic tunnel junction patterns MTJP1 and MTJP2.

According to the embodiment illustrated in FIGS. 6 and 7E, the distance d2 between the landing pad LPAD and the second magnetic tunnel junction pattern MTJP2 adjacent to each other may be greater than the distance d3 between the first and second magnetic tunnel junction patterns MTJP1 and MTJP2 when viewed from a plan view. Thus, even if the landing pads LPAD are exposed during the patterning process for forming the magnetic tunnel junction patterns MTJP1 and MTJP2, it is possible to substantially reduce or minimize the probability that the etch by-products generated from the landing pads LPAD will be re-deposited on the sidewalls of the magnetic tunnel junction patterns MTJP1 and MTJP2. In other words, according to embodiments of the inventive concepts, it is possible to substantially prevent or inhibit the magnetic tunnel junction patterns MTJP1 and MTJP2 from being short-circuited by the etch by-products of the landing pads LPAD, and thus reliability of the magnetic memory device may be improved.

Each of the first bit lines BL1 extending in the first direction D1 may be connected in common to the first magnetic tunnel junction patterns MTJP1 included in each of the memory columns 15. In addition, each of the second bit lines BL2 extending in the first direction D1 may be connected in common to the second magnetic tunnel junction patterns MTJP2 included in each of the memory columns 15. The first and second bit lines BL1 and BL2 may be substantially similar to those described with reference to FIG. 7A.

Figure 8A:
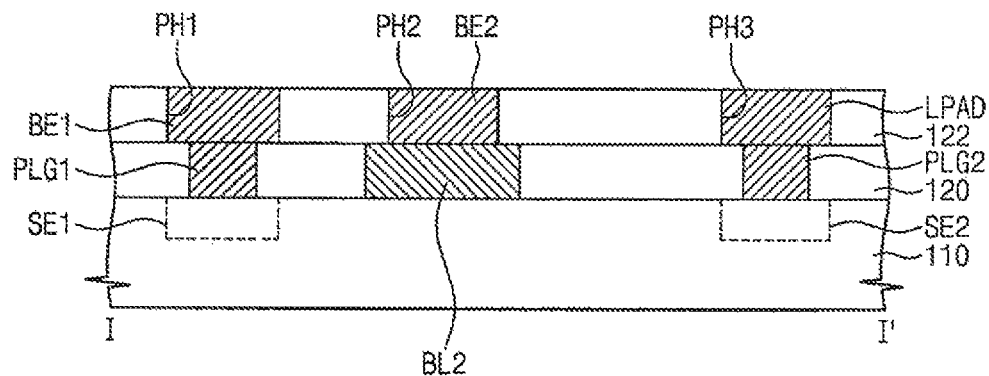
FIGS. 8A to 8C are cross-sectional views illustrating a method of manufacturing a unit memory cell of a magnetic memory device according to some embodiments of the inventive concepts.
Figure 8B:
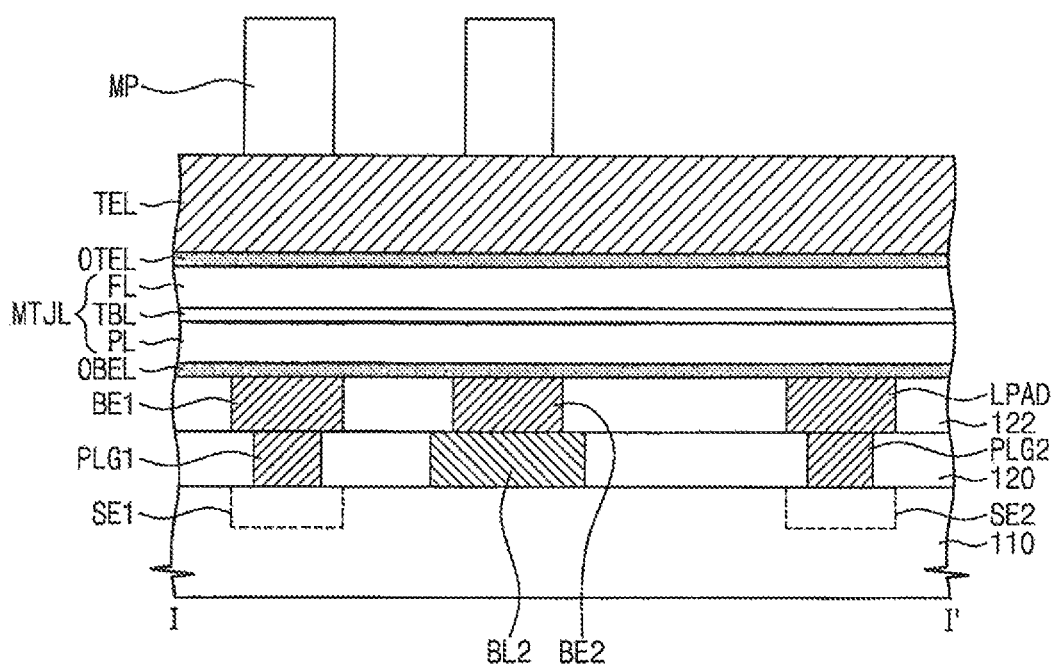
Figure 8C:
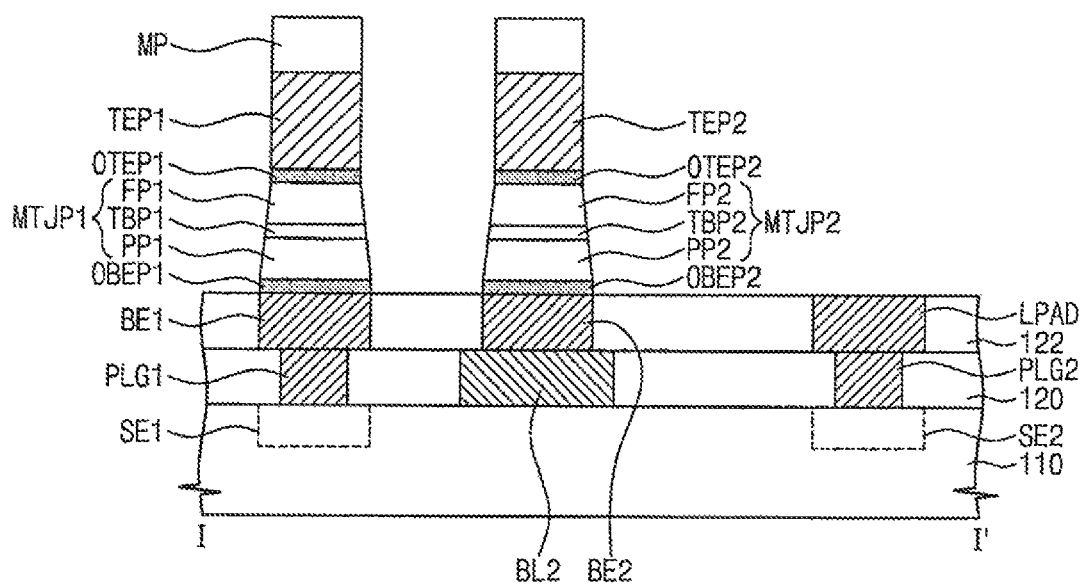

FIGS. 8A to 8C are cross-sectional views corresponding to the line I-I' of FIG. 4 to illustrate a method of manufacturing a unit memory cell of a magnetic memory device according to some embodiments of the inventive concepts. Hereinafter, the same elements as described in the embodiments of FIGS. 4, 5, and 6 will be indicated by the same reference numerals or the same reference designators, and the descriptions thereto will be omitted or mentioned briefly for the purpose of ease and convenience in explanation.

Referring to FIGS. 4 and 8A, a substrate 110 including first and second selection transistors SE1 and SE2 may be provided. A first interlayer insulating layer 120 may be formed on the substrate 110. For example, the first interlayer insulating layer 120 may include at least one of silicon oxide, silicon nitride, or silicon oxynitride. The first interlayer insulating layer 120 may be formed by, for example, a chemical vapor deposition (CVD) process or a physical vapor deposition (PVD) process.

First and second contact plugs PLG1 and PLG2 may be formed to penetrate the first interlayer insulating layer 120. The first contact plug PLG1 may be connected to the first selection transistor SE1, and the second contact plug PLG2 may be connected to the second selection transistor SE2. In addition, a second bit line BL2 may be formed in the first interlayer insulating layer 120.

A second interlayer insulating layer 122 may be formed on the first interlayer insulating layer 120. For example, the second interlayer insulating layer 122 may include at least one of silicon oxide, silicon nitride, or silicon oxynitride. The second interlayer insulating layer 122 may be formed by a CVD process or a PVD process.

First and second bottom electrodes BE1 and BE2 and a landing pad LPAD may be formed to penetrate the second interlayer insulating layer 122. Forming the first and second bottom electrodes BE1 and BE2 and the landing pad LPAD may include patterning the second interlayer insulating layer 122 to form first, second, and third through-holes PH1, PH2, and PH3 exposing the first contact plug PLG1, the second bit line BL2, and the second contact plug PLG2, respectively, forming a conductive layer filling the first to third through-holes PH1, PH2, and PH3 on the second interlayer insulating layer 122, and planarizing the conductive layer until a top surface of the second interlayer insulating layer 122 is exposed. Thus, top surfaces of the first and second bottom electrodes BE1 and BE2 and a top surface of the landing pad LPAD may be disposed at the substantially same level. The first bottom electrode BE1 may be electrically connected to the first contact plug PLG1, the second bottom electrode BE2 may be electrically connected to the second bit line BL2, and the landing pad LPAD may be electrically connected to the second contact plug PLG2.

Referring to FIGS. 4 and 8B, an optional bottom electrode layer OBEL, a magnetic tunnel junction layer MTJL, an optional top electrode layer OTEL, and a top electrode layer TEL may be sequentially formed on the second interlayer insulating layer 122. Each of the layers OBEL, MTJL, OTEL, and TEL may be formed by, for example, a CVD process or a PVD process.

The optional bottom electrode layer OBEL and the optional top electrode layer OTEL may include a conductive metal nitride such as titanium nitride and/or tantalum nitride. In some embodiments, at least one of the optional bottom electrode layer OBEL and the optional top electrode layer OTEL may be omitted. Hereinafter, the embodiments in which the optional bottom electrode layer OBEL and the optional top electrode layer OTEL are formed will be described as an example for the purpose of ease and convenience in explanation. However, embodiments of the inventive concepts are not limited thereto.

In some embodiments, the magnetic tunnel junction layer MTJL may include a pinned layer PL, a tunnel barrier layer TBL, and a free layer FL which are sequentially stacked. However, embodiments of the inventive concepts are not limited thereto. In certain embodiments, the free layer, the tunnel barrier layer TBL, and the pinned layer may be sequentially stacked. The magnetic tunnel junction layer MTJL will be described later in detail with reference to FIG. 9A and/or FIG. 9B.

Mask patterns MP may be formed on the top electrode layer TEL. The mask patterns MP may overlap with the first and second bottom electrodes BE1 and BE2, respectively, when viewed from a plan view. The mask patterns MP may include at least one of, but not limited to, silicon oxide, silicon nitride, or silicon oxynitride.

Referring to FIGS. 4 and 8C, a first optional bottom electrode pattern OBEP1, a first magnetic tunnel junction pattern MTJP1, a first optional top electrode pattern OTEP1, and a first top electrode pattern TEP1 may be sequentially formed on the first bottom electrode BE1. A second optional bottom electrode pattern OBEP2, a second magnetic tunnel junction pattern MTJP2, a second optional top electrode pattern OTEP2, and a second top electrode pattern TEP2 may be sequentially formed on the second bottom electrode BE2. Forming the patterns OBEP1, OBEP2, MTJP1, MTJP2, OTEP1, OTEP2, TEP1, and TEP2 may include sequentially patterning the top electrode layer TEL, the optional top electrode layer OTEL, the magnetic tunnel junction layer MTJL, and the optional bottom electrode layer OBEL using the mask patterns MP as etch masks. In some embodiments, the patterning process may be performed using an ion beam etching (IBE) process.

During the process of patterning the magnetic tunnel junction layer MTJL, etch by-products generated from the magnetic tunnel junction layer MTJL may be re-deposited on sidewalls of the magnetic tunnel junction patterns MTJP1 and MTJP2. Thus, the first and second magnetic tunnel junction patterns MTJP1 and MTJP2 may be short-circuited. The probability of the short circuit may increase as the distance d3 between the first and second magnetic tunnel junction patterns MTJP1 and MTJP2 decreases. However, according to embodiments of the inventive concepts, the distance d3 between the first and second magnetic tunnel junction patterns MTJP1 and MTJP2 may be substantially equal to greater than a minimum spacing distance substantially capable of preventing the first and second magnetic tunnel junction patterns MTJP1 and MTJP2 from being short-circuited by the etch by-products generated from the magnetic tunnel junction layer MTJL.

In general, a landing pad may be exposed and partially etched during a patterning process used to form a magnetic tunnel junction pattern. At this time, etch by-products generated from the landing pad may be re-deposited on a sidewall of the magnetic tunnel junction pattern, thereby causing a short circuit of the magnetic tunnel junction pattern. The probability of short-circuit occurring due to etching of the landing pad may increase as the distance between the magnetic tunnel junction pattern and the landing pad decreases.

However, according to embodiments of the inventive concepts, the distance d1 between the landing pad LPAD and the first magnetic tunnel junction pattern MTJP1 and the distance d2 between the landing pad LPAD and the second magnetic tunnel junction pattern MTJP2 may be greater than the distance d3 between the first and second magnetic tunnel junction patterns MTJP1 and MTJP2 when viewed from a plan view. Thus, even if the landing pad LPAD is exposed during the patterning process for forming the magnetic tunnel junction patterns MTJP1 and MTJP2, it is possible to reduce or minimize the probability that the etch by-products generated from the landing pad LPAD will be re-deposited on the sidewalls of the magnetic tunnel junction patterns MTJP1 and MTJP2. In other words, according to embodiments of the inventive concepts, it is possible to substantially prevent or inhibit the magnetic tunnel junction patterns MTJP1 and MTJP2 from being short-circuited by the etch by-products of the landing pad LPAD, and thus reliability of the magnetic memory device may be improved.

Referring again to FIGS. 4 and 5, a third interlayer insulating layer 124 may be formed on the second interlayer insulating layer 122 to cover the first and second magnetic tunnel junction patterns MTJP1 and MTJP2. The third interlayer insulating layer 124 may include at least one of, for example, silicon oxide, silicon nitride, or silicon oxynitride. For example, the third interlayer insulating layer 124 may be formed by a CVD process or a PVD process. In some embodiments, the third interlayer insulating layer 124 may be planarized until top surfaces of the first and second top electrode patterns TEP1 and TEP2 are exposed.

An interconnection contact INC may be formed to penetrate the third interlayer insulating layer 124. The interconnection contact INC may be connected to the landing pad LPAD. A first bit line BL1 and an interconnection pattern INP may be formed on the third interlayer insulating layer 124. The first bit line BL1 may be electrically connected to the first top electrode pattern TEP1, and the interconnection pattern INP may electrically connect the interconnection contact INC to the second top electrode pattern TEP2. In some embodiments, the interconnection contact INC, the interconnection pattern INP, and the first bit line BL1 may be formed using a damascene process at the same time.

Figure 9A:
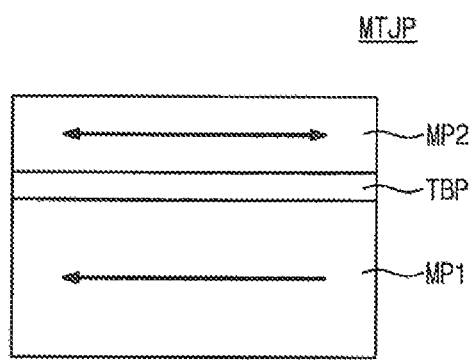
FIGS. 9A and 9B are conceptual diagrams illustrating magnetic tunnel junction patterns according to some embodiments of the inventive concepts.
Figure 9B:
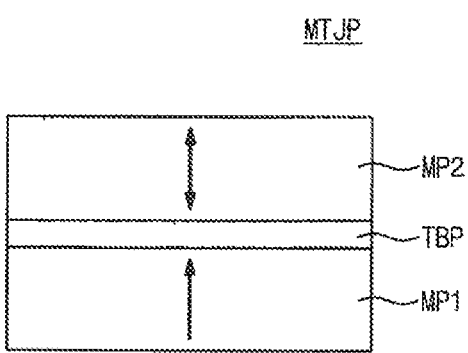

FIGS. 9A and 9B are conceptual diagrams illustrating magnetic tunnel junction patterns according to some embodiments of the inventive concepts. A magnetic tunnel junction pattern MTJP may include a first magnetic pattern MP1, a tunnel barrier pattern TBP, and a second magnetic pattern MP2. One of the first and second magnetic patterns MP1 and MP2 may correspond to a free pattern of a magnetic tunnel junction, and the other of the first and second magnetic patterns MP1 and MP2 may correspond to a pinned pattern of the magnetic tunnel junction. Hereinafter, for the purpose of ease and convenience in explanation, the first magnetic pattern MP1 will be described as the pinned pattern and the second magnetic pattern MP2 will be described as the free pattern. On the contrary, in certain embodiments, the first magnetic pattern MP1 may be the free pattern and the second magnetic pattern MP2 may be the pinned pattern. An electrical resistance value of the magnetic tunnel junction pattern MTJP may be determined depending on the magnetization directions of the free pattern and the pinned pattern. For example, the electrical resistance value of the magnetic tunnel junction pattern MTJP when the magnetization directions of the free and pinned patterns are anti-parallel to each other may be much greater than the electrical resistance value of the magnetic tunnel junction pattern MTJP when the magnetization directions of the free and pinned patterns are parallel to each other. As a result, the electrical resistance value of the magnetic tunnel junction pattern MTJP may be adjusted by changing the magnetization direction of the free pattern. This may be used as a data storing principle of the magnetic memory device according to some embodiments of the inventive concepts.

Referring to FIG. 9A, the magnetization directions of the first and second magnetic patterns MP1 and MP2 may be substantially parallel to a top surface of the tunnel barrier pattern TBP, and thus the first and second magnetic patterns MP1 and MP2 may constitute a horizontal magnetization structure. In these embodiments, the first magnetic pattern MP1 may include a layer including an anti-ferromagnetic material and a layer including a ferromagnetic material. In some embodiments, the layer including the anti-ferromagnetic material may include at least one of PtMn, IrMn, MnO, MnS, MnTe, $MnF_2$, $FeC_2$, FeO, $CoCl_2$, CoO, $NiCl_2$, NiO, or Cr. In some embodiments, the layer including the anti-ferromagnetic material may include at least one precious metal. The precious metal may include ruthenium (Ru), rhodium (Rh), palladium (Pd), osmium (Os), iridium (Ir), platinum (Pt), gold (Au), or silver (Ag). The layer including the ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MP2 may include a material having a changeable magnetization direction. The second magnetic pattern MP2 may include a ferromagnetic material. For example, the second magnetic pattern MP2 may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MP2 may include a plurality of layers. For example, the second magnetic pattern MP2 may include a plurality of ferromagnetic layers and a non-magnetic material layer disposed between the ferromagnetic layers. In this case, the ferromagnetic layers and the non-magnetic material layer may constitute a synthetic anti-ferromagnetic layer. The synthetic antiferromagnetic may reduce a critical current density of the magnetic memory device and may improve thermal stability of the magnetic memory device.

The tunnel barrier pattern TBP may include at least one of magnetic oxide (MgO), titanium oxide (TiO), aluminum oxide (AlO), magnesium-zinc oxide (MgZnO), magnesium-boron oxide (MgBO), titanium nitride (TiN), or vanadium nitride (VN). In some embodiments, the tunnel barrier pattern TBP may be a single layer formed of magnesium oxide (MgO). Alternatively, the tunnel barrier pattern TBP may include a plurality of layers. The tunnel barrier pattern TBP may be formed using a CVD process.

Referring to FIG. 9B, the magnetization directions of the first and second magnetic patterns MP1 and MP2 may be substantially perpendicular to the top surface of the tunnel barrier pattern TBP, and thus the first and second magnetic patterns MP1 and MP2 may constitute a perpendicular magnetization structure. In these embodiments, each of the first and second magnetic patterns MP1 and MP2 may include at least one of a material having a L10 crystal structure, a material having a hexagonal close packed (HCP) crystal structure, or an amorphous rare-earth transition metal (RE-TM) alloy. In some embodiments, each of the first and second magnetic patterns MP1 and MP2 may include at least one of $Fe_{50}Pt_{50}$ having the $L1_0$ crystal structure, $Fe_{50}Pd_{50}$ having the $L1_0$ crystal structure, $Co_{50}Pt_{50}$ having the $L1_0$ crystal structure, $Co_{50}Pd_{50}$ having the $L1_0$ crystal structure, or $Fe_{50}Ni_{50}$ having the $L1_0$ crystal structure. In some embodiments, each of the first and second magnetic patterns MP1 and MP2 may include a CoPt disordered alloy or $Co_3Pt$ ordered alloy which has the HCP crystal structure and includes a platinum content of 10 at. % to 45 at. %. In some embodiments, each of the first and second magnetic patterns MP1 and MP2 may include at least one amorphous RE-TM alloy which includes at least one selected from a group consisting of iron (Fe), cobalt (Co), and nickel (Ni) and at least one selected from a group consisting of terbium (Tb), dysprosium (Dy), and gadolinium (Gd) which are rare-earth metals.

In some embodiments, the first and second magnetic patterns MP1 and MP2 may include a material having interface perpendicular magnetic anisotropy (i-PMA). The interface perpendicular magnetic anisotropy may mean that a magnetic layer having an intrinsic horizontal magnetization property has a perpendicular magnetization direction by an influence of an interface between the magnetic layer and another layer adjacent to the magnetic layer. Here, the intrinsic horizontal magnetization property may mean that a magnetic layer has a magnetization direction parallel to the widest surface of the magnetic layer when an external factor does not exist. For example, when the magnetic layer having the intrinsic horizontal magnetization property is formed on a substrate and an external factor does not exist, the magnetization direction of the magnetic layer may be substantially parallel to a top surface of the substrate.

For example, each of the first and second magnetic patterns MP1 and MP2 may include at least one of cobalt (Co), iron (Fe), or nickel (Ni). In addition, each of the first and second magnetic patterns MP1 and MP2 may further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, each of the first and second magnetic patterns MP1 and MP2 may include CoFe or NiFe and may further include boron (B). In addition, to reduce saturation magnetizations of the first and second magnetic patterns MP1 and MP2, each of the first and second magnetic patterns MP1 and MP2 may further include at least one of titanium (Ti), aluminum (Al), silicon (Si), magnesium (Mg), or tantalum (Ta). Each of the first and second magnetic patterns MP1 and MP2 may be formed using a sputtering process or a CVD process.

The magnetic tunnel junction layer MTJL described with reference to FIG. 8B may include the substantially same material as the magnetic tunnel junction pattern MTJP of FIG. 9A or 9B.

According to some embodiments of the inventive concepts, the distances between the landing pad and the magnetic tunnel junction patterns may be greater than the distance between the magnetic tunnel junction patterns. Thus, even if the landing pad is exposed during the patterning process for forming the magnetic tunnel junction patterns, it is possible to reduce or minimize the probability that the magnetic tunnel junction pattern will be short-circuited by the etch by-products generated from the landing pad. In other words, according to some embodiments of the inventive concepts, it is possible to substantially prevent or inhibit the magnetic tunnel junction patterns from being short-circuited by the etch by-products of the landing pad, and thus the reliability of the magnetic memory device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device comprising:
    at least one memory column including a plurality of unit memory cells arranged in a first direction,
    wherein each of the unit memory cells comprises:
        a landing pad;
        a first magnetic tunnel junction pattern spaced apart from the landing pad by a first distance;
        a second magnetic tunnel junction pattern spaced apart from the landing pad by a second distance and spaced apart from the first magnetic tunnel junction pattern by a third distance;
        an interconnection structure electrically connecting the landing pad to a top surface of the second magnetic tunnel junction pattern;
        a first bit line electrically connected to top surfaces of the first magnetic tunnel junction patterns included in a first sub-column; and
        a second bit line electrically connected to bottom surfaces of the second magnetic tunnel junction patterns included in a second sub-column,
    wherein the first distance and the second distance are greater than the third distance,
    wherein the first magnetic tunnel junction patterns included in the memory column are arranged in the first direction to constitute the first sub-column,
    wherein the second magnetic tunnel junction patterns included in the memory column are arranged in the first direction to constitute the second sub-column,
    wherein the landing pads included in the memory column are arranged in the first direction to constitute a third sub-column,
    wherein the first to third sub-columns are spaced apart from each other in a second direction perpendicular to the first direction, and
    wherein the second sub-column is disposed between the first sub-column and the third sub-column.

2. The magnetic memory device of claim 1, wherein the first magnetic tunnel junction patterns included in the first sub-column and the second magnetic tunnel junction patterns included in the second sub-column are arranged in a zigzag pattern along the first direction.

3. The magnetic memory device of claim 1, wherein the second magnetic tunnel junction patterns included in the second sub-column and the landing pads included in the third sub-column are arranged in a zigzag form along the first direction.

4. The magnetic memory device of claim 1, wherein the at least one memory column includes first and second memory columns adjacent to each other in the second direction, and
    wherein the third sub-column of the first memory column is adjacent to the first sub-column of the second memory column.

5. The magnetic memory device of claim 4, wherein a distance in the second direction between the third sub-column of the first memory column and the first sub-column of the second memory column is greater than a distance in the second direction between the first and second sub-columns of the first memory column.

6. The magnetic memory device of claim 4, wherein a minimum distance between the landing pad included the third sub-column of the first memory column and the first magnetic tunnel junction pattern included in the first sub-column of the second memory column is greater than the third distance.

7. The magnetic memory device of claim 1, wherein the at least one memory column includes first and second memory columns adjacent to each other in the second direction, and wherein the first sub-column of the first memory column is adjacent to the first sub-column of the second memory column.

8. The magnetic memory device of claim 7, wherein a distance in the second direction between the first sub-column of the first memory column and the first sub-column of the second memory column is smaller than a distance in the second direction between the second and third sub-columns of the first memory column.

9. The magnetic memory device of claim 8, wherein the distance in the second direction between the first sub-column of the first memory column and the first sub-column of the second memory column is equal to a distance in the second direction between the first and second sub-columns of the first memory column.

10. The magnetic memory device of claim 8, wherein a minimum distance between the first magnetic tunnel junction pattern included in the first sub-column of the first memory column and the first magnetic tunnel junction pattern included in the first sub-column of the second memory column is smaller than the second distance.

* * * * *